(12) United States Patent
Shin

(10) Patent No.: US 11,695,267 B2
(45) Date of Patent: Jul. 4, 2023

(54) PROTECTIVE RELAY AND METHOD FOR DETECTING DISCONNECTION OF PROTECTIVE RELAY

(71) Applicant: LS ELECTRIC CO., LTD., Anyang-Si (KR)

(72) Inventor: Sangtack Shin, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 0 days.

(21) Appl. No.: 17/757,268

(22) PCT Filed: Nov. 9, 2020

(86) PCT No.: PCT/KR2020/015602
§ 371 (c)(1),
(2) Date: Jun. 13, 2022

(87) PCT Pub. No.: WO2021/118071
PCT Pub. Date: Jun. 17, 2021

(65) Prior Publication Data
US 2023/0006436 A1 Jan. 5, 2023

(30) Foreign Application Priority Data

Dec. 12, 2019 (KR) .................. 10-2019-0165893
Oct. 5, 2020 (KR) .................. 10-2020-0128167

(51) Int. Cl.
*H02H 7/04* (2006.01)
*H01F 27/40* (2006.01)

(52) U.S. Cl.
CPC .......... *H02H 7/042* (2013.01); *H01F 27/402* (2013.01)

(58) Field of Classification Search
CPC .................. H02H 7/042; H01F 27/402
(Continued)

(56) References Cited

U.S. PATENT DOCUMENTS

2013/0279048 A1* 10/2013 Juha .................. H02H 7/045
361/36

FOREIGN PATENT DOCUMENTS

JP 2010148284 A * 7/2010
JP 2010148284 A 8/2010
(Continued)

OTHER PUBLICATIONS

Machine translation of Imamura Japanese Patent Document JP 2011-188639 A Sep. 22, 2011 (Year: 2011).*
(Continued)

*Primary Examiner* — Kevin J Comber
(74) *Attorney, Agent, or Firm* — K&L Gates LLP

(57) ABSTRACT

The present disclosure relates to a protective relay detecting disconnection in a circuit comprising a disconnection detection unit including a plurality of nodes connected to both ends of an output of a transformation unit, a reference voltage generation unit forming a reference voltage, and a plurality of resistors forming a voltage dividing resistor and connecting the plurality of nodes and the reference voltage generation unit; a sensing voltage generation unit applying a voltage for forming a predetermined voltage difference with respect to the reference voltage; and a disconnection determination unit connected to a first node, in which the magnitude of a voltage signal applied by the voltage dividing resistor varies depending on whether at least one of the transformation unit and the circuit connected to the transformation unit is disconnected, and detecting whether at least one of the transformation unit and the circuit connected to the transformation unit is disconnected.

23 Claims, 19 Drawing Sheets

(58) Field of Classification Search
USPC .......................................................... 361/35
See application file for complete search history.

(56) References Cited

FOREIGN PATENT DOCUMENTS

| JP | 2011188639 | A | * | 9/2011 | | |
| JP | 2011188639 | A | | 9/2011 | | |
| JP | 2013123334 | A | * | 6/2013 | ........... | G01R 31/088 |
| KR | 2008100096 | A | * | 11/2008 | | |
| KR | 20090028269 | A | | 3/2009 | | |
| KR | 20130066482 | A | | 6/2013 | | |
| KR | 20170112578 | A | | 10/2017 | | |
| KR | 2017140389 | A | * | 12/2017 | ............. | G01R 15/18 |
| KR | 20170140389 | A | | 12/2017 | | |
| KR | 20190023122 | A | | 3/2019 | | |
| KR | 20210143551 | A | | 11/2021 | | |

OTHER PUBLICATIONS

Machine translation of Kato Japanese Patent Document JP 2013-123334 A Jun. 20, 2013 (Year: 2013).*
Machine translation of Pak Korean Patent Document KR 2008-0100096 A Nov. 14, 2008 (Year: 2008).*
Machine translation of Oda Korean Patent Document KR 2017-0140389 A Dec. 20, 2017 (Year: 2017).*
Machine translation of Date Japanese Patent Document JP 2010-148284 A Jul. 1, 2010 (Year: 2010).*
Notice of Allowance for related Korean Application No. 2020-0128167; action dated Dec. 26, 2022; (6 pages).
International Search Report for related International Application No. PCT/KR2020/015602; report dated Jun. 18, 2021; (9 pages).
Written Opinion for related International Application No. PCT/KR2020/015602; report dated Jun. 18, 2021; (4 pages).

* cited by examiner

VH: MAXIMUM INPUT VOLTAGE AT CONVERSION UNIT
VL: MINIMUM INPUT VOLTAGE AT CONVERSION UNIT

VH: MAXIMUM INPUT VOLTAGE AT CONVERSION UNIT
VL: MINIMUM INPUT VOLTAGE AT CONVERSION UNIT

PROTECTIVE RELAY AND METHOD FOR DETECTING DISCONNECTION OF PROTECTIVE RELAY

CROSS-REFERENCE TO RELATED APPLICATIONS

This application is the National Stage filing under 35 U.S.C. 371 of International Application No. PCT/KR2020/015602, filed on Nov. 9, 2020, which claims the benefit of earlier filing date and right of priority to Korean Application No. 10-2019-0165893, filed on Dec. 12, 2019 and Korean Application No. 10-2020-0128167, filed Oct. 5, 2020, the contents of which are all hereby incorporated by reference herein in their entirety.

FIELD

The present disclosure relates to a protective relay, and more particularly, to a protective relay that detects whether a transformation unit and a circuit connected to the transformation unit are disconnected in the circuit connected to the transformation unit.

BACKGROUND

In general, a transformation unit refers to a device that converts a voltage or current input from a power system into a smaller level of voltage or current, and is used to measure or relay the voltage and current of the power system.

Such a transformation unit may be divided into an instrument potential transformer (PT) that converts a voltage signal or an instrument current transformer (CT) that converts a current signal. Here, the instrument potential transformer (PT) may be divided into a general potential transformer using an iron core and a potential transformer using a voltage dividing method using a capacitor, a resistor, and the like. Furthermore, the instrument current transformer (CT) may be divided into a general current transformer using an iron core and a current transformer using a Rogowski coil using air as a core.

First, in a potential transformer or current transformer using an iron core, the iron core may stably provide a path that is a passage for a magnetic flux. Therefore, a signal having a better waveform may be output compared to an input signal. Accordingly, a phase of the input signal and a phase of the output signal may be in phase, and the input signal and the output signal are electrically insulated from each other, and thus there is an advantage in that insulation performance between multiple input signals, that is, insulation performance between phases, is excellent.

Meanwhile, the transformation unit may be disconnected due to an input voltage or current, a defect in an internal circuit constituting the transformation unit, or an external stress such as high temperature or vibration. In this way, when a disconnection occurs due to the transformation unit, a malfunction may occur in a relay element such as a low voltage relay, a ground fault relay, a low current relay, and a low power relay. In addition, such a disconnection of the transformation unit may cause a malfunction in a device that measures and converts an input voltage or an input current, or an output voltage or an output current, such as an inverter.

Therefore, the protective relay determines whether the transformation unit is disconnected in order to prevent the occurrence of such a malfunction. Furthermore, the determination of whether the transformation unit of the protective relay is disconnected can be made based on a result of detecting a magnitude of a voltage or current or a phase or vector sum input through the transformation unit.

However, there is a problem in that such a voltage, a current, a phase or vector sum, and the like, input through the transformation unit is measured to be the same in a state where no voltage signal or current signal is applied from the transformation unit (for example, a state where no voltage signal or current signal is applied during a normal operation of the transformation unit) and a case where a circuit is disconnected due to the transformation unit. Alternatively, when a circuit disconnection due to the transformation unit occurs, it may become a high impedance (negative) state in which a current or voltage signal input from the transformation unit cannot be identified, and in this case, there is a problem in that it is difficult to distinguish whether a detected signal is a signal detected by the high impedance state, that is, the disconnection state or a signal actually detected from the transformation unit.

In addition, when a short-circuit current or an in-rush current generated during the start-up of the transformation unit flows in, a magnitude of a voltage detected through the transformation unit is temporarily changed due to large energy generated by the short-circuit current or the in-rush current. However, a typical method using a voltage, current, or phase or vector sum has a problem in that it is difficult to distinguish between a change in current or voltage signal due to the inflow of the short-circuit current or the in-rush current and a change in current or voltage signal due to a circuit disconnection due to the transformation unit, and accordingly, when the short-circuit current or the in-rush current is generated, it is determined as a disconnection even though the circuit is normally connected.

SUMMARY

An aspect of the present disclosure is to solve the foregoing and other problems, and to provide a protective relay and a disconnection detection method capable of more accurately detecting a circuit disconnection due to a transformation unit.

Furthermore, another aspect of the present disclosure is to provide a protective relay capable of accurately distinguishing between a state in which a voltage signal or a current signal is not applied from the transformation unit and a state in which a circuit is disconnected due to the transformation unit, and a method of detecting a disconnection in the protective relay.

In addition, still another aspect of the present disclosure is to provide a protective relay capable of distinguishing whether a change of a signal detected from the transformation unit is due to a short-circuit current or an in-rush current of a motor, a potential transformer or the like when the change of the signal detected from the transformation unit occurs due to the short-circuit current or the in-rush current, and a method of detecting a disconnection in the protective relay.

In order to achieve the foregoing or other objectives, according to an aspect of the present disclosure, a protective relay according to an embodiment of the present disclosure may include a disconnection detection unit including a plurality of nodes connected to both output ends of the transformation unit, a reference voltage generation unit that defines a reference voltage, and a plurality of resistors constituting a voltage dividing resistor and connecting between the plurality of nodes and the reference voltage generation unit, a sensing voltage generation unit that applies a voltage for defining a predetermined voltage difference with respect to the reference voltage to the disconnection detection unit, and a disconnection determination unit connected to a first node at which a magnitude of a voltage signal applied by the voltage dividing resistor varies according to whether at least one of the transformation unit and a circuit connected to the transformation unit is disconnected, among the plurality of nodes, and configured to detect whether at least one of the transformation unit and a circuit connected to the transformation unit is disconnected from a voltage signal detected from the first node.

According to an embodiment, the disconnection determination unit may extract a DC offset value from a voltage signal detected from the first node and compare the extracted DC offset value with a preset threshold voltage to detect a magnitude of an AC component from the voltage signal detected from the first node when the DC offset value is less than the threshold voltage as a result of the comparison, and to determine whether at least one of the transformation unit and a circuit connected to the transformation unit is disconnected based on the detected magnitude of the AC component.

According to an embodiment, the disconnection determination unit may determine whether at least one of the transformation unit and a circuit connected to the transformation unit is disconnected according to whether the detected magnitude of the AC component is greater than a preset magnitude, wherein the preset magnitude is determined according to the magnitude of the AC component included in the voltage signal detected from the first node when a short-circuit current or an in-rush current generated during the start-up of the transformation unit.

According to an embodiment, when it is primarily determined that at least one of the transformation unit and a circuit connected to the transformation unit is disconnected according to a result of comparing the extracted DC offset value with a preset threshold voltage, the disconnection determination unit may further reflect a preset design margin value to the extracted DC offset value, secondarily determine that at least one of the transformation and a circuit connected to the transformation unit is disconnected based on a result of comparing the threshold voltage with the DC offset value to which the design margin value is further reflected, and detect the disconnection of at least one of the transformation unit and the circuit connected to the transformation unit.

According to an embodiment, the design margin may include a preset error value, wherein the preset error value comprises at least one of a measurement error generated in a process of extracting a DC offset value from a voltage signal detected from the first node and a design error according to a circuit configuration of the disconnection detection unit.

According to an embodiment, the threshold voltage may be the same voltage as that applied from the sensing voltage generation unit when the reference voltage is a ground voltage.

According to an embodiment, the disconnection detection unit may include a first contact disposed between the first node and the disconnection determination unit, a second node connected to an end that is different either one end to which the first node is connected between both output ends of the transformation unit, a third contact disposed between the second node and the sensing voltage generation unit, a second contact disposed in an electric circuit connecting between the first contact and the third contact, a first resistor disposed between the first contact and the second contact, a second resistor connected between the second contact and the reference voltage generation unit and disposed between the reference voltage generation unit and the second contact, and a third resistor disposed between the second contact and the third contact.

According to an embodiment, the disconnection detection unit may include a first contact disposed between the first node and the disconnection determination unit, a second node connected to an end that is different either one end to which the first node is connected between both output ends of the transformation unit, a third contact disposed between the second node and the sensing voltage generation unit, a second contact disposed in an electric circuit connecting between the first contact and the third contact, a second resistor connected between the second contact and the reference voltage generation unit and disposed between the reference voltage generation unit and the second contact, and a third resistor disposed between the second contact and the third contact.

According to an embodiment, the disconnection detection unit may include a first contact disposed between the first node and the disconnection determination unit, a second node connected to an end that is different either one end to which the first node is connected between both output ends of the transformation unit, a third contact disposed between the second node and the sensing voltage generation unit, a second contact disposed in a circuit connecting between the first contact and the third contact and connected to the reference voltage generation unit, and a first resistor disposed between the first contact and the second contact; and a third resistor disposed between the second contact and the third contact.

According to an embodiment, when the transformation unit and a circuit connected to the transformation unit are in a normally-connected state, a voltage signal having the same magnitude as a voltage applied from the sensing voltage generation unit may be applied to the first node, wherein a DC offset value detected from a voltage signal applied to the first node when at least one of the transformation unit and a circuit connected to the transformation unit is in a disconnected state is less than a DC offset value detected from a voltage signal applied to the first node when the transformation unit and a circuit connected to the transformation unit are in a normally-connected state.

According to an embodiment, in a case where a voltage applied by the sensing voltage generation unit is greater than the reference voltage, when at least one of the transformation unit and a circuit connected to the transformation unit is in a disconnected state, a voltage signal according to a difference between the reference voltage and a voltage applied from the sensing voltage generation unit and a magnitude of a resistance constituting the voltage dividing resistor is applied as shown in Equation below.

$$n1(V) = n2(V),$$
$$n2(V) = (VR - VS) \times \frac{R2}{R2 + R3}, (\text{if, } VS < VR)$$
[Equation]

Here, n1(v) is a magnitude of a voltage signal applied to a first contact, n2(v) is a magnitude of a voltage signal applied to a second contact, VS is a reference voltage, VR is a voltage applied from a sensing voltage generation unit, R2 is a resistance value of a second resistor, and R3 is a resistance value of a third resistor.

According to an embodiment, when the extracted DC offset value is less than a preset threshold voltage, the disconnection determination unit may further add a preset design margin value to the extracted DC offset value, and compare the DC offset value to which the design margin value is added with the threshold voltage to detect the disconnection of at least one of the transformation unit and a circuit connected to the transformation unit.

According to an embodiment, the reference voltage may be a ground voltage.

According to an embodiment, when the transformation unit and a circuit connected to the transformation unit are in a normally-connected state, a voltage signal having the same magnitude as a voltage applied from the sensing voltage generation unit may be applied to the first node, wherein a DC offset value detected from a voltage signal applied to the first node when at least one of the transformation unit and a circuit connected to the transformation unit is in a disconnected state is greater than a DC offset value detected from a voltage signal applied to the first node when the transformation unit and a circuit connected to the transformation unit are in a normally-connected state.

According to an embodiment, in a case where a voltage applied by the sensing voltage generation unit is greater than the reference voltage, when at least one of the transformation unit and a circuit connected to the transformation unit is in a disconnected state, a voltage signal according to a voltage applied from the sensing voltage generation unit, a difference between the voltage applied from the sensing voltage generation unit and the reference voltage, and a magnitude of a resistance constituting the voltage dividing resistor may be 4 applied as shown in Equation below.

$$n1(V) = n2(V),$$
$$n2(V) = VR + (VS - VR) \times \frac{R2}{R2 + R3}, \text{(if, } VS < VR)$$ [Equation]

Here, n1(v) is a magnitude of a voltage signal applied to a first contact, n2(v) is a magnitude of a voltage signal applied to a second contact, VS is a reference voltage, VR is a voltage applied from a sensing voltage generation unit, R2 is a resistance value of a second resistor, and R3 is a resistance value of a third resistor.

According to an embodiment, when the extracted DC offset value is greater than a preset threshold voltage, the disconnection determination unit may subtract a preset design margin value from the extracted DC offset value, and compare the DC offset value from which the design margin value is subtracted with the threshold voltage to detect the disconnection of at least one of the transformation unit and a circuit connected to the transformation unit.

According to an embodiment, a voltage of the sensing voltage generation unit may be a ground voltage.

According to an embodiment, when the transformation unit is a transformation unit using a Rogowski coil, an integration circuit for restoring a delay waveform according to the characteristics of the Rogowski coil may be included between the disconnection detection unit and the disconnection determination unit, wherein the disconnection determination unit integrates the DC offset value and detects the disconnection of at least one of the transformation unit and a circuit connected to the transformation unit based on a result of comparing the integrated DC offset value with the threshold voltage.

According to an embodiment, the disconnection determination unit may further include an output unit configured to output an alarm signal indicating a disconnection state of at least one of the transformation unit and a circuit connected to the transformation unit, wherein the output unit includes a communication function for transmitting the alarm signal to another preset device.

In order to achieve the foregoing and other objectives, according to an aspect of the present disclosure, a method of detecting a disconnection in a protective relay according to an embodiment of the present disclosure may include providing a plurality of nodes connected to both output ends of the transformation unit, and providing a plurality of resistors constituting a voltage dividing resistor to detect a voltage signal from a disconnection detection unit in which voltage signals applied to the plurality of nodes vary according to whether at least one of the transformation unit and a circuit connected to the transformation unit is disconnected, and acquire a DC offset value from the detected voltage signal, comparing the acquired DC offset value with a preset threshold voltage to primarily determine whether at least one of the transformation unit and a circuit connected to the transformation unit is disconnected, calculating a magnitude of an AC component from the detected voltage signal according to the primary determination result, comparing the calculated magnitude of the AC component with a preset AC current signal magnitude to determine whether a short-circuit current or an in-rush current of the transformation unit is generated, and secondarily determining whether at least one of the transformation unit and a circuit connected to the transformation unit is disconnected according to a result of determining whether the short-circuit current or the in-rush current is generated.

According to an embodiment, the primarily determining of whether there is a disconnection may include comparing the acquired DC offset value with a preset threshold voltage, reflecting a preset design margin value to the DC offset value according to a comparison result between the DC offset value and a preset threshold voltage, and comparing the DC offset value to which the design margin value is reflected with the threshold voltage to determine whether at least one of the transformation unit and a circuit connected to the transformation unit is disconnected.

According to an embodiment, the secondarily determining of whether there is a disconnection may further include outputting alarm information indicating a disconnection state when it is determined that at least one of the transformation unit and a circuit connected to the transformation unit is disconnected as a result of the secondary determination, wherein when it is determined that the transformation unit and a circuit connected to the transformation unit are normally connected, the method further comprises acquiring the DC offset value or performing the secondarily determining whether there is a disconnection according to whether a preset period has expired.

According to an embodiment, the preset period may be determined based on a time period during which a main operation of a device connected to the protective relay is performed.

According to at least one of the embodiments of the present disclosure, the present disclosure may include a disconnection detection unit that detects a different voltage in a state where a transformation unit is normally connected and a state where a disconnection of the transformation unit occurs, respectively, to determine whether the transformation unit is disconnected based on the voltage detected by the disconnection detection unit, thereby having an effect capable of accurately distinguishing between a state where a voltage signal or a current signal is not applied from the transformation unit and a state where a circuit is disconnected due to the transformation unit.

In addition, according to at least one of the embodiments of the present disclosure, when it is determined that a disconnection by the transformation unit has occurred as a result of the detection of the disconnection detection unit, the present disclosure may detect a magnitude of an AC component from a voltage signal input from the transformation unit, and detect whether a short-circuit current or an in-rush current is generated according to the detected magnitude of the AC component, thereby having an effect capable of distinguishing whether the detection result of the disconnection detection unit is caused by the short-circuit current or the in-rush current.

DETAILED DESCRIPTION

It should be noted that technical terms used herein are merely used to describe a specific embodiment, but not to limit the present disclosure. In addition, a singular expression used herein may include a plural expression unless clearly defined otherwise in the context. A suffix "module" or "unit" used for elements disclosed in the following description is merely intended for easy description of the specification, and the suffix itself does not give any special meaning or function.

In this application, the terms "comprising" and "including" should not be construed to necessarily include all of the elements or steps disclosed herein, and should be construed not to include some of the elements or steps thereof, or should be construed to further include additional elements or steps.

In describing the technology disclosed herein, moreover, the detailed description will be omitted when specific description for publicly known technologies to which the invention pertains is judged to obscure the gist of the technology disclosed in the present specification.

Furthermore, the accompanying drawings are provided only for a better understanding of the embodiments disclosed herein and are not intended to limit technical concepts disclosed herein, and therefore, it should be understood that the accompanying drawings include all modifications, equivalents and substitutes within the concept and technical scope of the present disclosure. In addition, not only each of embodiments described below, but also combinations of the embodiments are modifications, equivalents, and substitutes included in the concept and technical scope of the present disclosure, and may of course fall within the concept and technical scope of the present disclosure.

Figure 1:
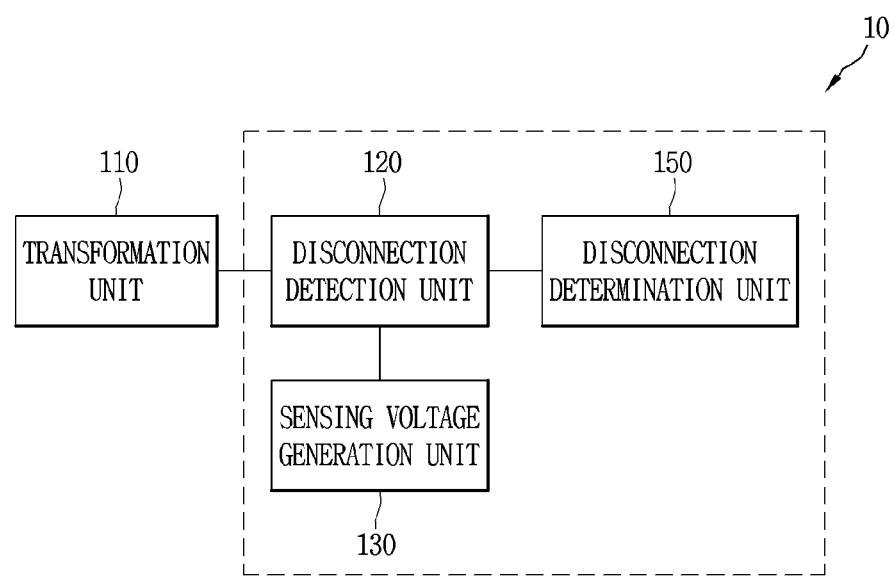
FIG. 1 is a block diagram illustrating a configuration of a protective relay according to an embodiment of the present disclosure connected to a transformation unit.
Figure 2:
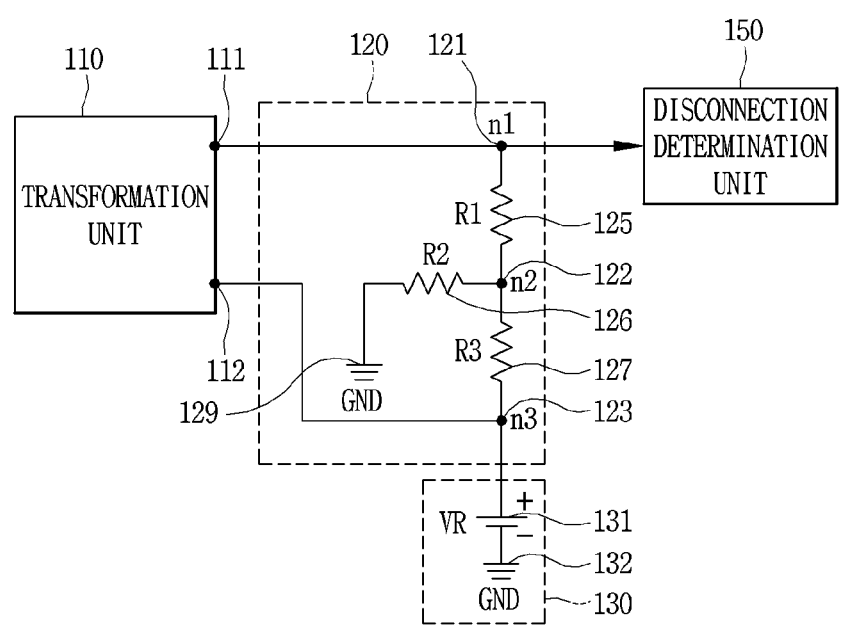
FIG. 2 is a circuit diagram illustrating a circuit configuration of a disconnection detection unit and a sensing voltage generation unit in a protective relay according to an embodiment of the present disclosure.
Figure 3:
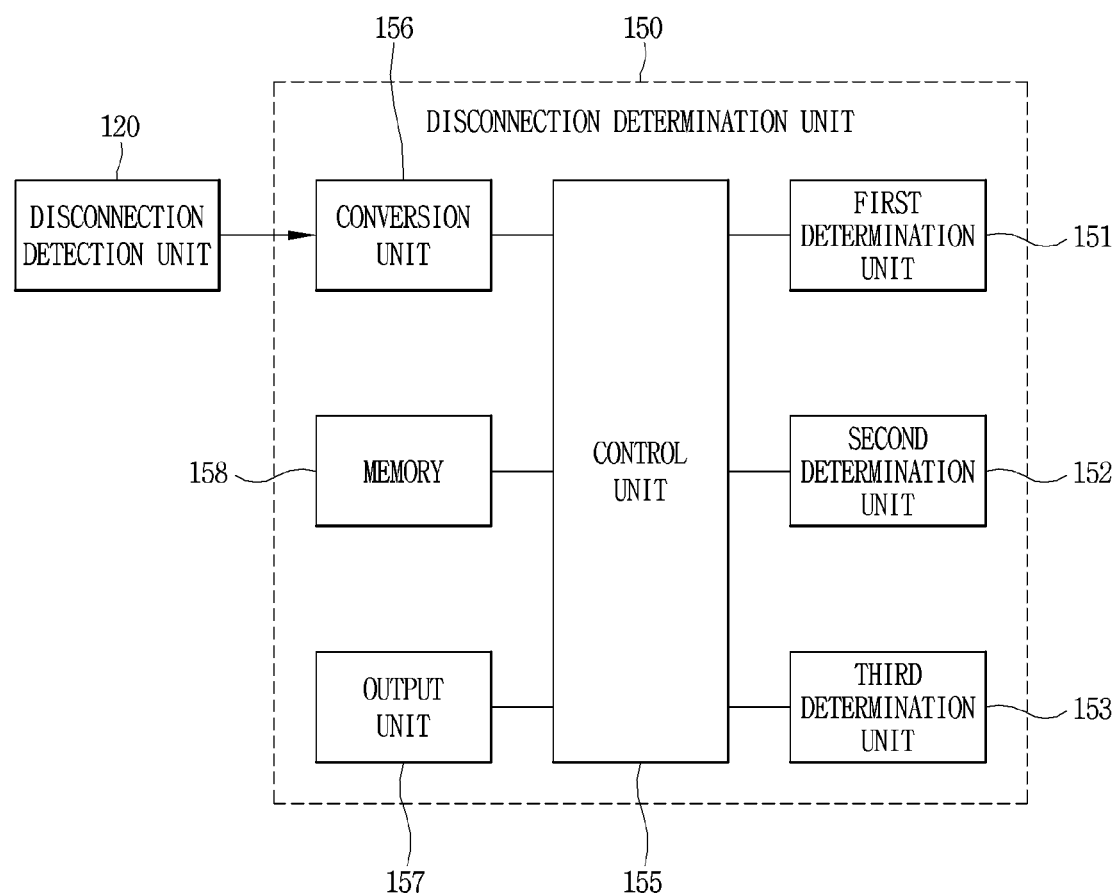
FIG. 3 is a block diagram for explaining a configuration of a disconnection determination unit in a protective relay according to an embodiment of the present disclosure.

FIG. 1 is a block diagram illustrating a configuration of a protective relay 10 according to an embodiment of the present disclosure connected to a transformation unit 110. Furthermore, FIG. 2 is a circuit diagram illustrating a circuit configuration of a disconnection detection unit 120 and a sensing voltage generation unit 130 in a protective relay according to an embodiment of the present disclosure. In addition, FIG. 3 is a block diagram for explaining a configuration of a disconnection determination unit 150 in a protective relay according to an embodiment of the present disclosure.

First, referring to FIG. 1, the protective relay 10 according to an embodiment of the present disclosure may include the disconnection detection unit 120 disposed to be connected to the transformation unit 110, the sensing voltage generation unit 130 that applies a predetermined voltage to the disconnection detection unit 120, and the disconnection determination unit 150 capable of determining a circuit connection state to the transformation unit 110 based on a voltage signal detected at the disconnection detection unit 120.

First, the transformation unit 110, which is a device that converts a voltage or current input from a power system into a voltage or current at a lower level, may include a potential transformer (PT) or a current transformer (CT).

The potential transformer may be a potential transformer using a resistance voltage dividing method or a potential transformer using an iron core according to a voltage conversion method. Furthermore, the current transformer may be a current transformer using an iron core or a Rogowski coil type current transformer using an air core according to a current conversion method.

In addition, the disconnection detection unit 120 may include nodes respectively connected to both output ends of the transformation unit 110. Accordingly, a circuit may be configured when both output ends of the transformation unit 110 are connected to the nodes, and the circuit between the nodes may be disconnected when the transformation unit 110 is disconnected.

Meanwhile, either one of the nodes (hereinafter referred to as a first node 111) may be connected to the disconnection determination unit 150, and the other node (hereinafter referred to as a second node 112) may be connected to the sensing voltage generation unit 130.

Referring to FIG. 2 illustrating a circuit structure of the disconnection detection unit 120, the disconnection detection unit 120 may include a plurality of resistors (R1, R2, R3) 125, 126, 127 constituting a voltage dividing resistor.

The first resistor (R1) 125 of the plurality of resistors (R1, R2, R3) 125, 126, 127 may be connected to a first contact (n1) 121 disposed between the first node 111 and the disconnection determination unit 150. Furthermore, the third resistors (R3) 127 may be connected to a third contact (n3) 123 disposed between the second node 112 and the sensing voltage generation unit 130.

The first contact (n1) 121 and the third contact (n3) 123 may be connected to each other. Furthermore, a second contact (n2) 122 may be disposed in an electrical circuit connecting between the first contact (n1) 121 and the third contact (n3) 123. Here, the first resistor (R1) 125 may be disposed between the first contact (n1) 121 and the second contact (n2) 122, and the second resistor (R2) 126 may be disposed between the second contact (n2) 122 and the third contact (n3) 123.

In addition, the second contact (n2) 122 may be connected to a reference voltage generation unit 129 that provides a reference voltage to the disconnection detection unit 120. Another resistor (second resistor (R2) 126) constituting the voltage dividing resistor may be disposed between the second contact (n2) 122 and the reference voltage generation unit 129.

Here, the reference voltage generation unit 129 may be configured with a ground that provides a ground voltage as the reference voltage.

Accordingly, when a circuit between the first node 111 and the second node 112 is normally connected, a circuit in which the first contact (n1) 121 and the third contact (n3) 123 are connected to each other may be configured. Therefore, a predetermined voltage applied through the sensing voltage generation unit 130 may be applied to the first contact (n1) 121.

On the contrary, when a circuit between the first node 111 and the second node 112 is disconnected, that is, when the transformation unit 110 is disconnected, the first contact (n1) 121 and the third contact (n3) 123 are disconnected from each other. Accordingly, a voltage signal having a difference between a voltage applied from the sensing voltage generation unit 130 and a voltage applied from the reference voltage generation unit 129, and a voltage divided by a plurality of resistors constituting the voltage dividing resistor may be applied to the first contact (n1) 121.

Meanwhile, since the disconnection determination unit 150 detects a voltage signal of the first contact (n1) 121 connected to the first node 111, the detected voltage signal may vary according to a circuit connection state between the first node 111 and the second node 112, that is, whether the transformation unit 110 is disconnected.

Meanwhile, the sensing voltage generation unit 130 may apply a voltage for defining a predetermined voltage difference with respect to the reference voltage to the disconnection detection unit 120. To this end, the sensing voltage generation unit 130 may be disposed to provide a voltage at a different magnitude from that of the reference voltage generation unit 129 of the disconnection detection unit 120.

For an example, when the reference voltage generation unit 129 of the disconnection detection unit 120 is configured with a ground form as shown in FIG. 2 to provide a ground voltage, the sensing voltage generation unit 130 may be configured to provide a voltage different from the ground voltage. To this end, the sensing voltage generation unit 130 may further include a voltage generation unit 131 for applying a predetermined direct current (DC) voltage to the disconnection detection unit 120 in addition to a ground 132. Hereinafter, a voltage applied by the sensing voltage generation unit 130 will be referred to as 'VR'.

On the contrary, when the reference voltage generation unit 129 of the disconnection detection unit 120 is configured to apply a predetermined direct current (DC) voltage other than a ground voltage, the sensing voltage generation unit 130 may of course be configured in a ground form to provide a ground voltage.

In addition, the reference voltage generation unit 129 and the sensing voltage generation unit 130 may also be respectively configured to apply a predetermined voltage greater than the ground voltage. In this case, the reference voltage generation unit 129 and the sensing voltage generation unit 130 may be configured to apply different DC voltages.

Meanwhile, the disconnection determination unit 150 may determine whether a circuit disconnection has occurred by the transformation unit 110 based on a voltage signal detected by the disconnection detection unit 120. To this end, as shown in FIG. 3, the disconnection determination unit 150 may include a control unit 155, a conversion unit 156 connected to the control unit 155, a plurality of determination units (a first determination unit 151, a second determination unit 152, a third determination unit 153), and a memory 158. Furthermore, the disconnection determination unit 150 may further include an output unit 157 for outputting a result of determining whether a circuit is disconnected.

First, the conversion unit 156 may convert an analog voltage signal detected by the disconnection detection unit 120 into a signal that can be identified by the disconnection determination unit 150. For an example, the conversion unit 156 may be an analog-to-digital converter (ADC).

Meanwhile, a range of a voltage signal that can be processed by the conversion unit 156 may be limited. Accordingly, the disconnection detection unit 120 may be configured such that a voltage signal within a range that can be processed by the conversion unit 156 is input to the conversion unit 156. For an example, in a case where a signal range that can be processed by the conversion unit 156 is 0 to 3.3 V, the reference voltage generation unit 129 and the sensing voltage generation unit 130 may be configured to input different voltage signals of 0 to 3.3 V to the transformation unit 110 when the circuit is normally connected and when the circuit is disconnected.

That is, when the circuit is in a normally-connected state, the reference voltage generation unit 129 and the sensing voltage generation unit 130 may be configured to input a voltage signal having a center voltage of 1.65 V to the conversion unit 156. However, when the circuit is in a disconnected state, the reference voltage generation unit 129 and the sensing voltage generation unit 130 of the disconnection detection unit 120 may be configured to input a voltage signal having a voltage less than (when a voltage of the reference voltage generation unit 129 is less than that of the sensing voltage generation unit 130) or greater than (when a voltage of the reference voltage generation unit 129 is greater than that of the sensing voltage generation unit 130) the 1.65 V to the conversion unit 156.

Meanwhile, the memory 158 may store data supporting a function of the disconnection determination unit 150. In more detail, the memory 158 may store data and instructions related to an application program driven by the first determination unit 151, the second determination unit 152, and the third determination unit 153 provided in the disconnection determination unit 150.

For an example, information on a preset threshold voltage may be stored as data for the determination of the first determination unit 151, and information on a resistance of the second resistor (R2) 126, a resistance of the third resistor (R3) 127, a voltage of the reference voltage generation unit 129 constituting the voltage dividing resistor, and a magnitude of a voltage according to a design margin may be stored as data for the determination of the second determination unit 152, in the memory 158. In addition, as data for the determination of the third determination unit 153, information on a minimum AC current component that can be detected during the occurrence of a fault current such as a short-circuit current or an in-rush current of the transformation unit 110, that is, a magnitude of a fault current signal, may be stored.

Meanwhile, the control unit 155 may be configured to control other elements connected thereto, and may control an overall operation of the disconnection determination unit 150.

First, when a voltage signal is converted into a digital signal through the conversion unit 156, the control unit 155 may acquire a DC offset value from the converted voltage signal. In addition, the control unit 151 may control the first determination unit 151 to compare a magnitude of the acquired DC offset value with a magnitude of a preset threshold voltage.

As described above, when a circuit disconnection due to the transformation unit 110 has occurred, a magnitude of a voltage applied to the first contact 121 may be less than (when a voltage of the reference voltage generation unit 129 is less than that of the sensing voltage generation unit 130) or greater than (when a voltage of the reference voltage generation unit 129 is greater than that of the sensing voltage generation unit 130) that when the circuit connected to the transformation unit 110 is normal. Accordingly, when the preset threshold voltage is the same as a DC offset value of a voltage signal that can be detected when the circuit connected to the transformation unit 110 is normal, the control unit 155 may determine whether the circuit connected to the transformation unit 110 is disconnected according to the comparison result of the first determination unit 151.

On the other hand, when a disconnection determination result (hereinafter referred to as a primary disconnection determination result) according to a comparison result of the first determination unit 151 is determined to be in a disconnection state, the control unit 155 may determine whether a difference between the acquired DC offset value and the threshold voltage is within a preset error range.

To this end, the control unit 155 may reflect a preset margin value to the acquired DC offset value. Furthermore, the control unit 155 may control the second determination unit 152 to compare a magnitude of the acquired DC offset value to which the margin value is reflected with the threshold voltage again.

As a result of the determination of the second determination unit 152, when a magnitude of the DC offset value to which the margin value is reflected is less than (when a voltage of the reference voltage generation unit 129 is less than that of the sensing voltage generation unit 130) or greater than (when a voltage of the reference voltage generation unit 129 is greater than that of the sensing voltage generation unit 130) the threshold voltage, the control unit 155 may determine that a difference between the DC offset value and the threshold voltage is out of a preset error range. Then, the control unit 155 may determine again that the circuit connected to the transformation unit 110 is disconnected. Hereinafter, a disconnection determination result according to the second determining unit 152 will be referred to as a secondary disconnection determination result.

On the other hand, when an in-rush current is generated during the start-up of the transformation unit 110 or a short-circuit current is generated due to a short circuit, a magnitude of a voltage signal having a DC component detected by the disconnection detection unit 120 may be changed though the in-rush current or the short-circuit current is an AC component. Accordingly, when the in-rush current or the short-circuit current is generated even though the circuit is not disconnected, the magnitude of the voltage signal detected at the first contact 121 may decrease or increase by a predetermined level or more.

Accordingly, when it is determined that the circuit is disconnected as a result of the secondary disconnection determination, the control unit 155 may determine whether the determination result is due to the generation of the in-rush current or the short-circuit current.

To this end, the control unit 155 may detect a magnitude of an alternating current (AC) component signal by calculating a root mean square (RMS) value from a voltage signal converted by the conversion unit 156. Then, the control unit 155 may control the third determination unit 153 to determine whether the detected AC signal component is greater than a preset signal magnitude of a fault current.

Here, the fault current may denote the short-circuit current or the in-rush current of the transformation unit. Accordingly, the preset signal magnitude of the fault current may be determined as a minimum magnitude of an AC signal component that can be detected by the disconnection detection unit 120 when the short-circuit current or the in-rush current of the transformation unit is generated. The signal magnitude of the fault current may be preset by a user or may be determined based on a result of a number of repeated experiments performed in connection with the present disclosure.

Meanwhile, as a result of the determination of the third determination unit 153, when the magnitude of the AC signal component detected from the converted voltage signal is less than the preset signal magnitude of the fault current, the control unit 155 may determine that the short-circuit current or the in-rush current is not generated. Accordingly, the control unit 155 may determine that a current disconnection state of the circuit is not due to the short-circuit current or the in-rush current, and finally determine that the circuit connected to the transformation unit 110 is disconnected.

When it is finally determined that the circuit is disconnected, the control unit 155 may control the output unit 157 to transmit an alarm signal indicating a disconnection state of the circuit to the user.

For an example, the control unit 155 may output an alarm signal as an audible signal or a visible signal through the output unit 157. Alternatively, the control unit 155 may transmit the alarm signal to another preset device, for example, the user's mobile terminal, or the like, through the output unit 157, and control the mobile terminal to output an alarm signal, thereby transferring the alarm signal to the user. To this end, the output unit 157 may include a communication function for transmitting the alarm signal.

Hereinafter, an operation process of the protective relay 10 according to an embodiment of the present disclosure will be described in more detail with reference to a flowchart and a plurality of exemplary diagrams. In addition, for convenience of explanation, in the following embodiment, a description will be given on the assumption that the reference voltage generation unit 129 is configured to have a ground voltage, and the sensing voltage generation unit 130 has a separate voltage generation unit 131 so as to have a voltage higher than the ground voltage.

FIGS. 4 to 8 are diagrams for explaining an operation process of the disconnection determination unit 150 configured to determine whether a circuit is disconnected by the transformation unit 110 according to a voltage signal detected from the disconnection detection unit 120 in the protective relay 10 according to an embodiment of the present disclosure.

Figure 4:
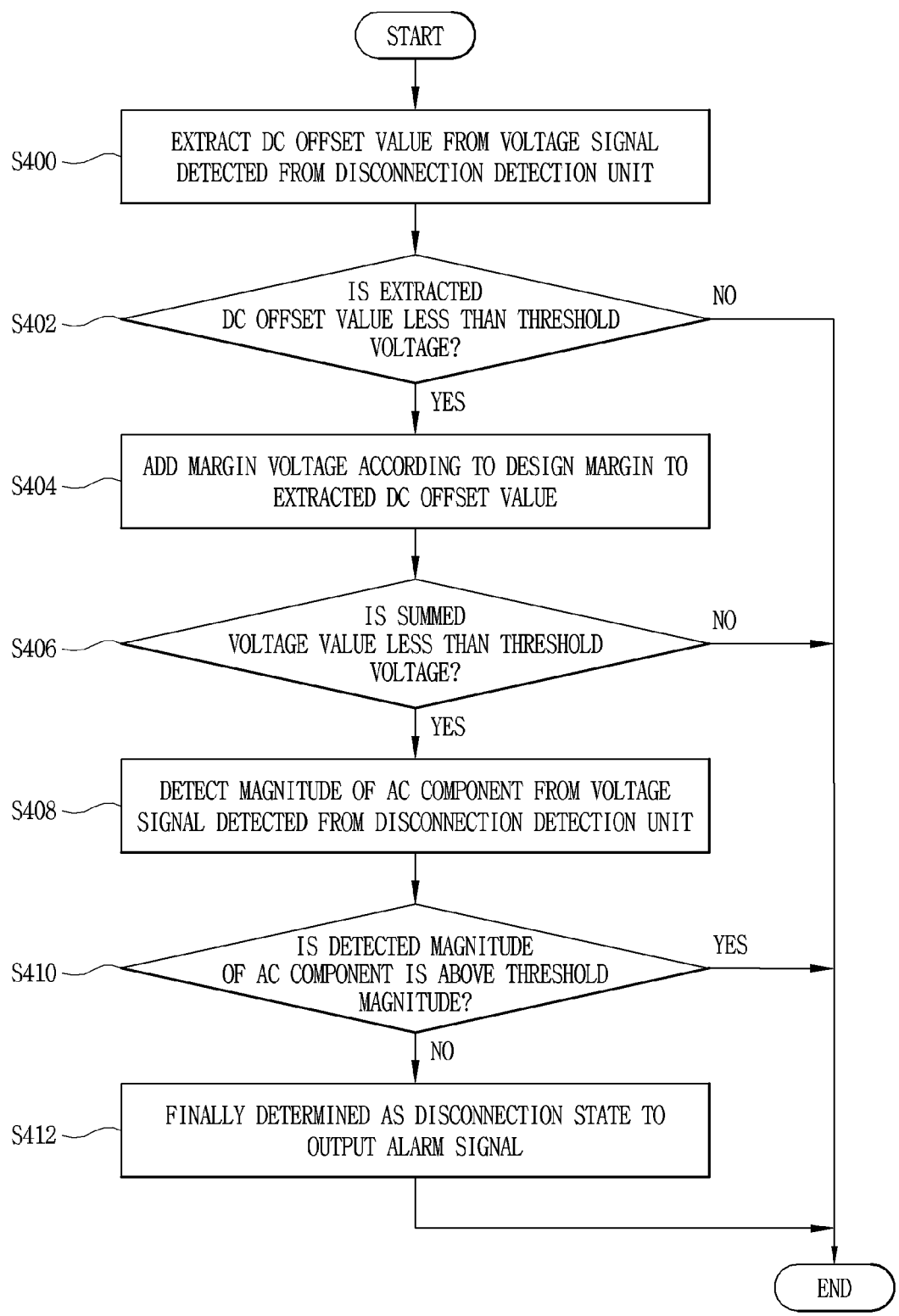
FIG. 4 is a flowchart illustrating an operation process of a disconnection determination unit that determines whether a transformation unit is disconnected according to a voltage signal detected from a disconnection detection unit in a protective relay according to an embodiment of the present disclosure.
Figure 5:
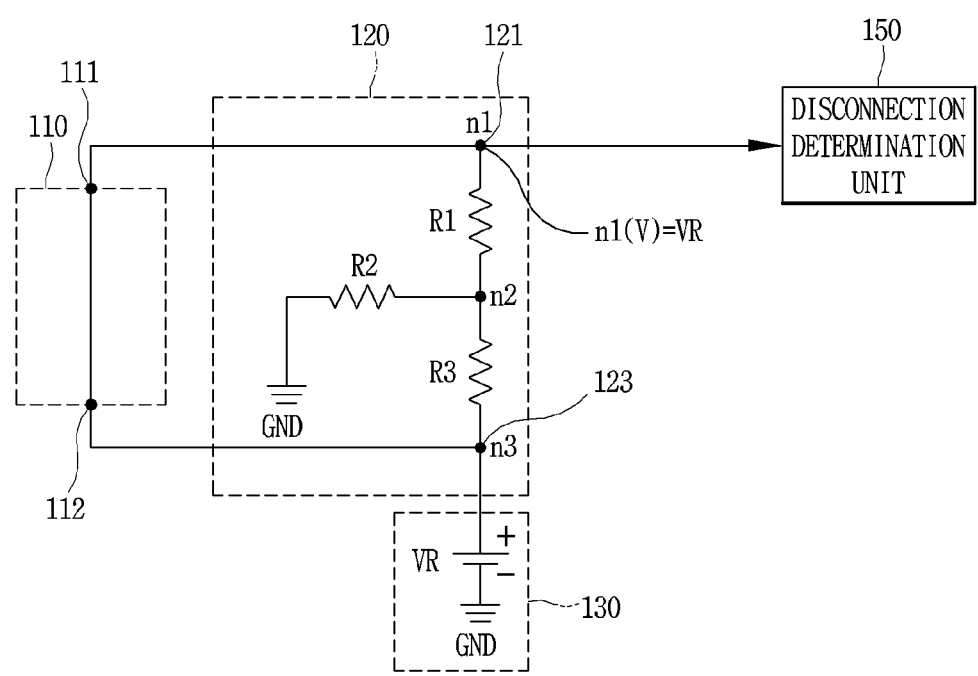
FIG. 5 is a diagram illustrating a magnitude of a voltage signal detected by a disconnection detection unit when a transformation unit is normally connected in a protective relay according to an embodiment of the present disclosure.
Figure 6:
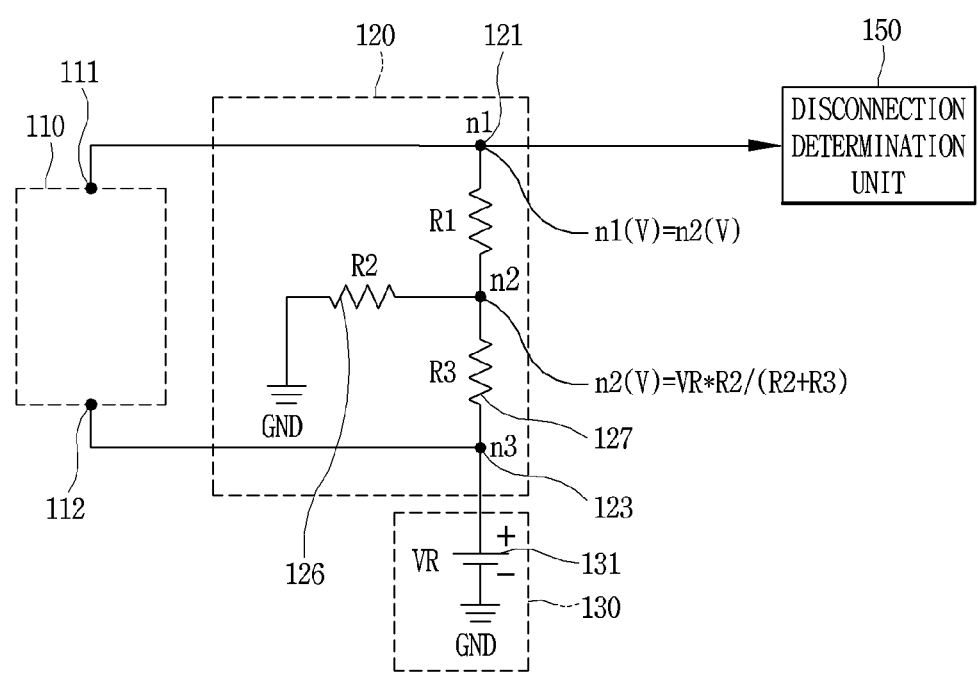
FIG. 6 is a diagram illustrating a magnitude of a voltage signal detected by the disconnection detection unit when the transformation unit is disconnected in a protective relay according to an embodiment of the present disclosure.

FIG. 4 is a flowchart illustrating an operation process of the disconnection determination unit 150, and FIG. 5 is a diagram illustrating a magnitude of a voltage signal detected by the disconnection detection unit 120 when the transformation unit 110 is normally connected in the protective relay 10 according to an embodiment of the present disclosure. Furthermore, FIG. 6 is a diagram illustrating a magnitude of a voltage signal detected by the disconnection detection unit 120 when the transformation unit 110 is disconnected in the protective relay 10 according to an embodiment of the present disclosure.

Figure 7:
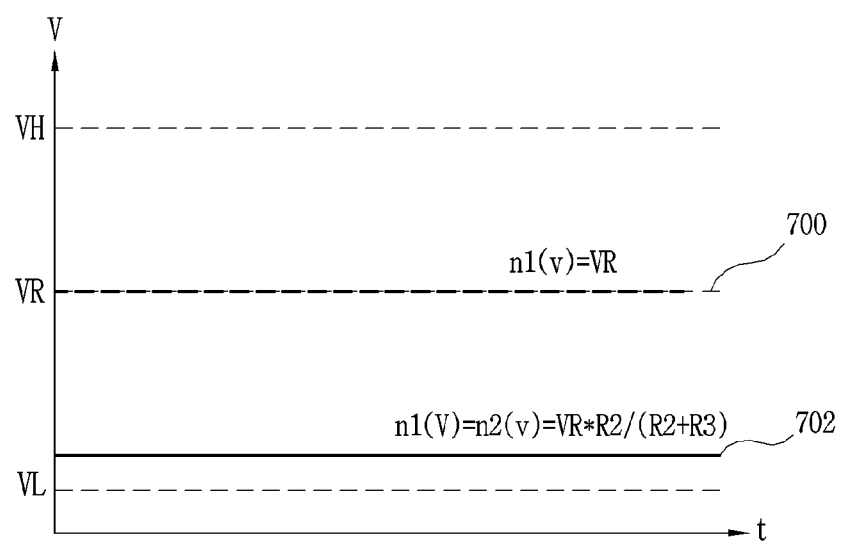
FIG. 7 is an exemplary diagram illustrating DC offset values detected by the disconnection detection unit when the transformation unit is normally connected and when disconnected in a protective relay according to an embodiment of the present disclosure.
Figure 8:
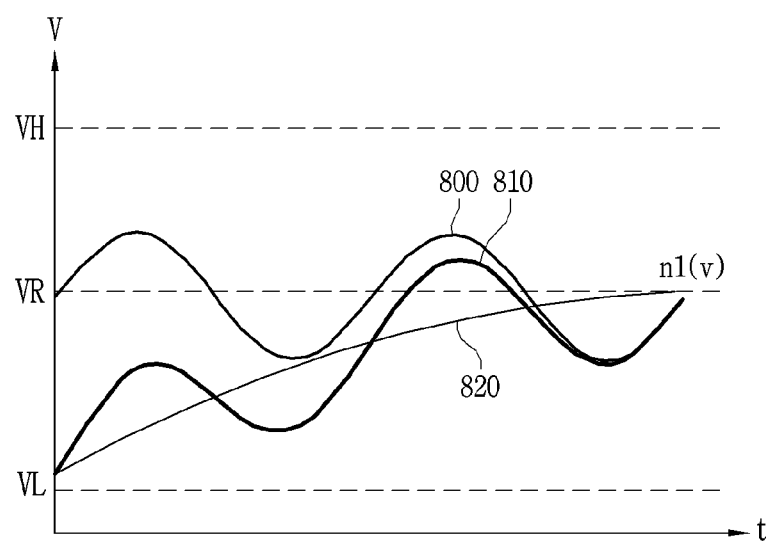
FIG. 8 is an exemplary diagram illustrating an example of an in-rush current or a short-circuit current of a transformation unit having a negative voltage flowing in from the transformation unit.

In addition, FIG. 7 is an exemplary diagram illustrating a difference in DC offset value detected by the disconnection detection unit between when the transformation unit is normally connected and when disconnected in the protective relay 10 according to an embodiment of the present disclosure, and FIG. 8 is an exemplary diagram illustrating an example of an in-rush current or a short-circuit current of the transformation unit 110 having a negative voltage flowing in from the transformation unit.

First, the control unit 155 of the disconnection determination unit 150 provided in the protective relay 10 according to an embodiment of the present disclosure may repeatedly perform an operation process of determining whether the transformation unit 110 is disconnected according to a preset period as shown below in FIG. 4. Here, the preset period may be a period corresponding to a period of a signal input to the transformation unit 110 from a line, and in this case, an operation process as shown below in FIG. 4 may be performed every time a main operation of the protective relay 10 is carried out.

In this case, the main operation of the protective relay 10 may vary depending on a device connected to the protective relay 10. For example, the main operation may be a relay operation when a device connected to the protective relay 10 is a digital relay, and may be a measurement operation when the connected device is a digital measuring instrument. Furthermore, when the connected device is a power conversion device, the main operation may be a power conversion operation.

Referring to FIG. 4, in a case where a preset period has expired, when a voltage signal from the disconnection detection unit 120, that is, a voltage signal applied to the first contact 121 connected to the disconnection detection unit 120 is detected, the control unit 155 may convert the voltage signal through the conversion unit 156, and extract a value of a direct current (DC) component, that is, a DC offset value, from the converted sampling digital data of one cycle (S400).

In addition, the control unit 155 may control the first determination unit 151 to compare the extracted DC offset value with a preset threshold voltage to primarily determine whether a circuit is disconnected (S402).

As shown in FIG. 5, a circuit in which the third contact 123 and the first contact 121 are connected through the transformation unit 110 may be configured when the circuit connected to the transformation unit 110 is in a normal state. Therefore, as shown in FIG. 5, a reference voltage VR of the sensing voltage generation unit 130 connected to the third contact 123 may be applied to the first contact 121 through the transformation unit 110.

In this case, since the transformation unit 110 is in a normal state and an impedance of the transformation unit 156 is much greater than a line resistance of the transformation unit 110, a voltage of the first contact (n1) 121 may be the same as that applied to the third contact (n3) 123. Therefore, in a case where the circuit is normally connected to the transformation unit 110, when the reference voltage VR is applied to the third contact (n3) 123, the reference voltage VR that is the same as that applied to the third contact (n3) 123 may be applied to the first contact (n1) 121. Accordingly, a DC offset value of a voltage signal corresponding to the reference voltage VR may be extracted through the conversion unit 156.

On the contrary, as shown in FIG. 6, when the circuit is disconnected by the transformation unit 110, the first contact 121 and the third contact 123 may not be connected between each other. Then, the disconnection determination unit 150 enters a high impedance state, and accordingly, the same voltage signal as that of the second contact 122 may be applied to the first contact 121 as shown in Equation 1 below.

$$n1(V) = n2(V) \quad \text{[Equation 1]}$$

Here, n1(v) is a magnitude of a voltage signal applied to the first contact 121, and n2(v) is a magnitude of a voltage signal applied to the second contact 122.

Meanwhile, a voltage signal determined by a voltage dividing resistor consisting of the second resistor (R2) 126 and the third resistor (R3) 127 and the reference voltage VR applied from the sensing voltage generation unit 130 may be applied to the second contact (n2) 122. Equation 2 below shows a magnitude of the voltage signal applied to the second contact (n2) 122 according to the voltage dividing resistor and the reference voltage VR.

$$n2(V) = VR \times \frac{R2}{R2 + R3} \quad \text{[Equation 2]}$$

Here, n2(v) is a magnitude of a voltage signal applied to the second contact 122, VR is a reference voltage, R2 is a resistance value of the second resistor (R2) 126, and R3 is a resistance value of the third resistor (R3) 127.

Meanwhile, according to Equation 2 above, n2(v) has a magnitude according to the product of a value less than 1 and the reference voltage VR, and thus always has a value smaller than the reference voltage VR. Therefore, as shown in FIG. 7, a magnitude 700 of the DC offset value extracted when the connection of the circuit is in a normal state may always have a value greater than a magnitude 702 of the DC offset value extracted when the connection of the circuit is in a disconnected state.

Accordingly, in a case where the threshold voltage is the reference voltage VR, when the circuit is in a disconnected state in the step S402, the DC offset value extracted in the step S400 may be smaller than the threshold voltage. Therefore, as a result of the determination in step S402, when a magnitude of the currently extracted DC offset value is less than the threshold voltage, the control unit 155 may primarily determine that the circuit connected to the current transformation unit 110 is disconnected.

On the contrary, in the step S402, when the DC offset value extracted in the step S400 is not less than the threshold value, the control unit 155 may determine that the circuit is not disconnected. Furthermore, when it is determined that the circuit is not disconnected as a result of the determination in the step S402, the control unit 155 may end a disconnection determination process in a current period.

Meanwhile, when the circuit connected to the transformation unit 110 is in a disconnected state as a result of the primary disconnection determination in the step S402, the control unit 155 may add a voltage value according to a design margin to the currently extracted DC offset value (S404). Here, the voltage value according to the design margin may further include a preset error value. Here, the error value may be a measurement error, and may further include an error that may occur in a conversion process of the conversion unit 156.

In the step S404, when a design margin including the error value is added to the DC offset value, the control unit 155 controls the second determination unit 152 to compare the summed voltage value with the threshold voltage again (S406).

Furthermore, as a result of the comparison in step S406, when a voltage value obtained by adding the DC offset value and the design margin is above the threshold voltage, the control unit 155 may determine that the circuit is in a non-disconnected state. Furthermore, when it is determined that the circuit is not disconnected as a result of the determination in the step S406, the control unit 155 may end a disconnection determination process in a current period.

However, as a result of the comparison in step S406, even though the design margin is added to the DC offset value, when the summed voltage value is less than the threshold voltage, the control unit 155 may determine again that the circuit currently connected to the transformation unit 110 is disconnected (secondary disconnection determination).

Meanwhile, when it is secondarily determined that the circuit connected to the current transformation unit 110 is disconnected, the control unit 155 may determine whether a difference between the DC offset value and the threshold voltage is caused by a short-circuit current or an in-rush current according to the start-up of the transformation unit 110.

The short-circuit current or the in-rush current is generated when the circuit is short-circuited or the transformation unit 110 is started, and refers to a very large and temporarily generated current that is several times higher than that of a normal operation state of the transformation unit 110. The short-circuit current or the in-rush current has a pattern in which the magnitude gradually decreases after an instantaneous large current flows.

On the other hand, the short-circuit current or the in-rush current may have a positive voltage, as well as have a negative value compared to a normal case 800 in a voltage graph (an AC component 810 and a DC component 820) as shown in FIG. 8. In this case, since the short-circuit current or the in-rush current has very large energy (a voltage signal having a negative voltage), as shown in FIG. 8, a DC component applied from the sensing voltage generation unit 130, that is, a value of the reference voltage (VR) may be decreased. Then, a magnitude of a voltage signal applied to the first contact (n1) 121 may be lowered, and as a result, the magnitude of the voltage signal detected at the first contact 121 may be detected to be lower than the threshold voltage (VR).

In order to prevent whether the circuit is disconnected from being erroneously determined due to the short-circuit current or the in-rush current, the control unit 155 of the protective relay 10 according to the embodiment of the present disclosure may further detect a magnitude of an alternating current (AC) component from the sampling digital data of one cycle converted by the conversion unit 156 when it is determined that the circuit is disconnected as a result of the secondary disconnection determination of the step S406 (S408). For example, the control unit 155 may detect the magnitude of the AC component using a method of calculating a root mean square (RMS) or the like. In addition, the detected magnitude of the AC component may be compared with a preset fault current signal magnitude (S410).

On the other hand, when the detected magnitude of the fault current signal is above a preset fault current signal magnitude as a result of the comparison in the step S410, the control unit 155 may determine that a short-circuit current or an in-rush current according to the start-up of the transformation unit 110 has occurred. In addition, it may be determined that the disconnection state of the circuit according to a result of the determination (secondary disconnection determination) in the step S406 is erroneously determined due to the occurrence of the short-circuit current or the in-rush current.

That is, when it is determined that a short-circuit current or an in-rush current has occurred according to a result of the determination in the step S410, the control unit 155 may determine that the circuit is normally connected despite the secondary disconnection determination result. Accordingly, the control unit 155 may end a process of determining whether the circuit is disconnected in a current period without outputting an alarm signal or the like.

On the contrary, as a result of the comparison in the step S410, when the detected magnitude of the AC component is less than a preset fault current signal magnitude, the control unit 155 may determine that a short-circuit current or an in-rush current according to the start-up of the transformation unit 110 has not occurred. Accordingly, the control unit 155 may finally determine that the circuit currently connected to the transformation unit 110 is disconnected, and may output an alarm signal for transferring the disconnection of the circuit to the user (S412).

As described above, when it is determined that the circuit is disconnected based on a voltage signal detected from the disconnection detection unit 120, the protective relay 10 according to an embodiment of the present disclosure may determine once again whether the voltage signal is included in an error range using a preset margin voltage. Accordingly, it may be possible to prevent in advance a disconnection state of the circuit from being erroneously determined due to a measurement error or a design error.

In addition, when it is determined that the circuit is disconnected based on a voltage signal detected from the disconnection detection unit 120, the protective relay 10 according to an embodiment of the present disclosure may detect whether a short-circuit current or an in-rush current is generated based on a magnitude of an AC component signal detected from the voltage signal, thereby further determining whether the voltage signal is affected by the short-circuit current or the in-rush current. Accordingly, it may be possible to prevent in advance a disconnection state of the circuit from being erroneously determined due to the effect of the short-circuit current or the in-rush current.

Meanwhile, in the above description, it has been mentioned that as an example of the transformation unit 110, a resistance voltage dividing type potential transformer, a potential transformer (PT) using an iron core, a current transformer (CT) using an iron core, a current transformer using a Rogowski coil, or the like can be used. FIGS. 9 to 12 are drawings illustrating examples in which the foregoing various types of transformation units 110 are connected to the protective relay 10 according to an embodiment of the present disclosure.

Figure 9:
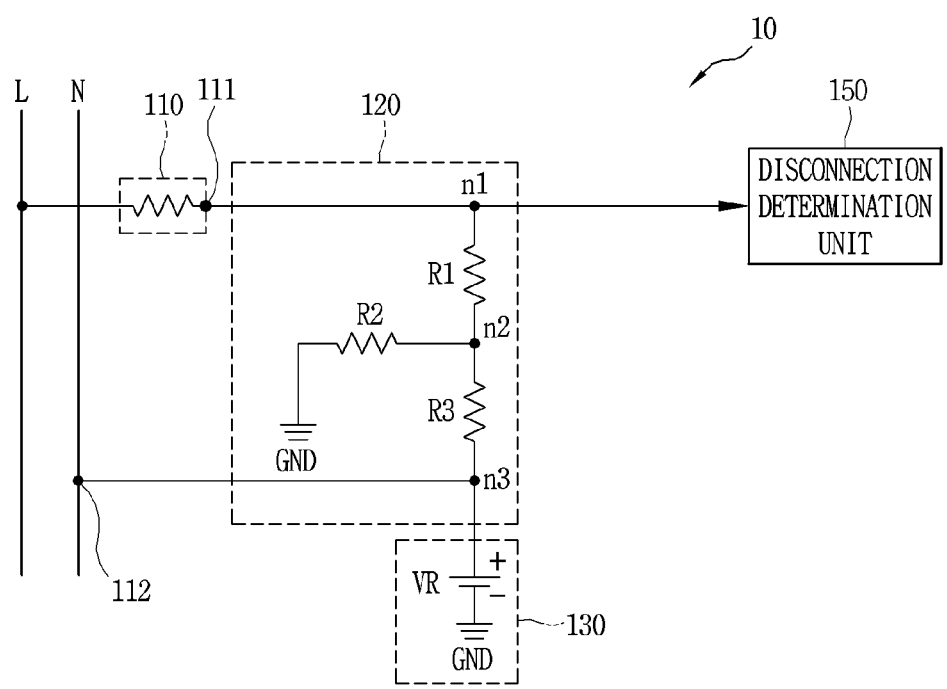
FIGS. 9 to 12 are exemplary diagrams illustrating examples in which a protective relay according to an embodiment of the present disclosure is connected to different types of transformation units.

First, FIG. 9 shows an example in which the protective relay 10 according to an embodiment of the present disclosure is connected to a resistance voltage dividing type potential transformer as the transformation unit 110.

Referring to FIG. 9, when the transformation unit 110 is a transformer according to a resistance voltage dividing method, a resistor for voltage conversion may serve as the transformation unit 110. Therefore, either one of the first and second nodes 111, 112 of the disconnection detection unit may be connected to the resistor 110 for voltage conversion, and the other node may be directly connected to the line. Then, a circuit of the disconnection detection unit 120 may be configured through the lines L, N and the resistor 110.

Figure 10:
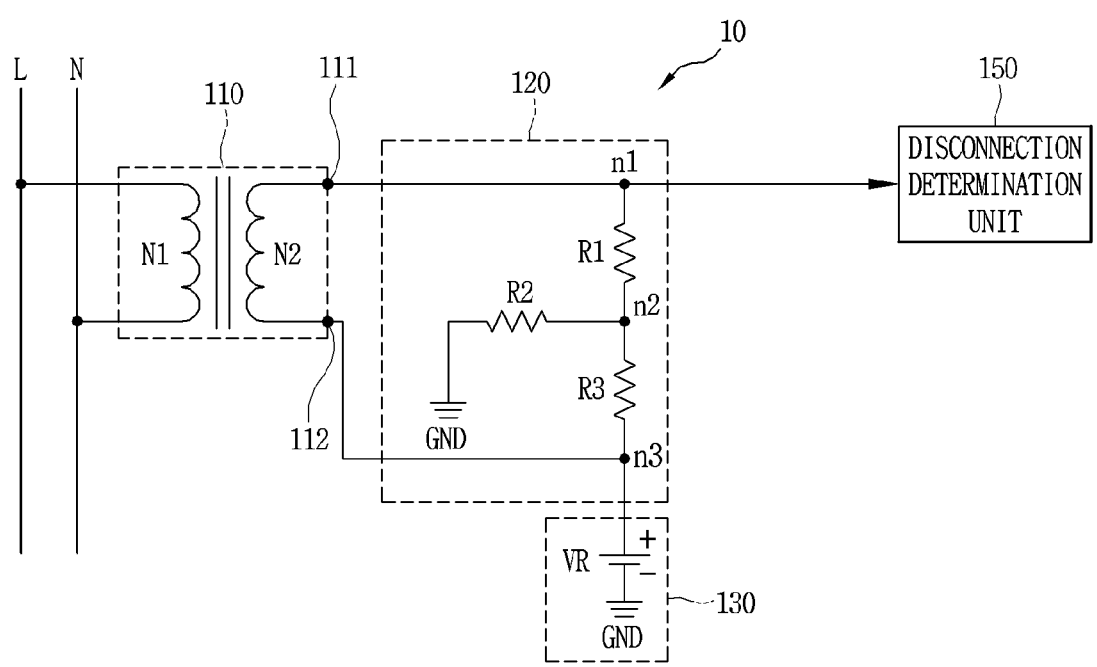

Furthermore, FIG. 10 shows an example in which the protective relay 10 according to an embodiment of the present disclosure is connected to a potential transformer (PT) using an iron core as the transformation unit 110.

Referring to FIG. 10, when the transformation unit 110 is the potential transformer (PT) using an iron core, the first and second nodes 111, 112 of the disconnection detection unit may be connected to both ends of the potential transformer (PT) 110, respectively, to configure a circuit of the disconnection detection unit 120 connected through the potential transformer (PT) 110.

Figure 11:
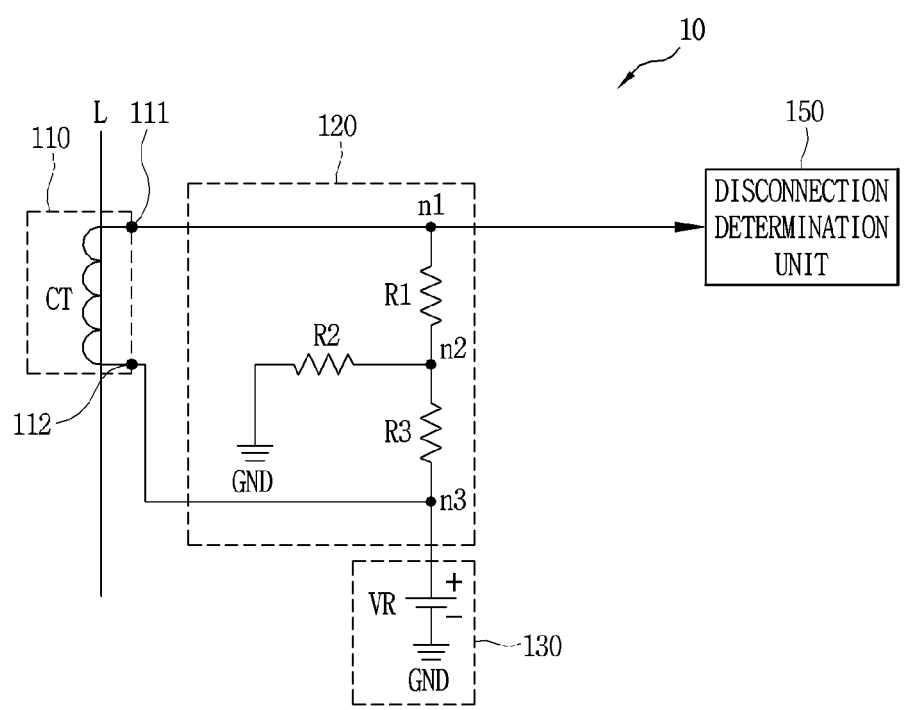

In addition, FIG. 11 shows an example in which the protective relay 10 according to an embodiment of the present disclosure is connected to a current transformer (CT) using an iron core as the transformation unit 110.

Referring to FIG. 11, when the transformation unit 110 is the current transformer CT using an iron core, the first and second nodes 111, 112 of the disconnection detection unit may be connected to both ends of the current transformer (CT) 110, respectively, to configure a circuit of the disconnection detection unit 120 connected through the current transformer (CT) 110.

Figure 12:
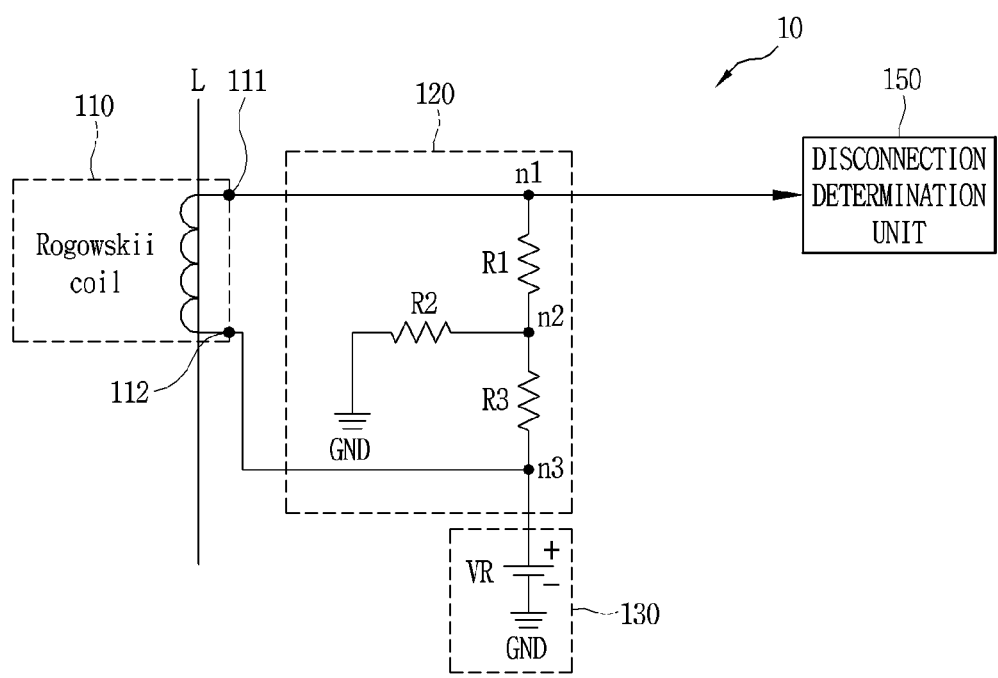

Meanwhile, FIG. 12 shows an example in which the protective relay 10 according to an embodiment of the present disclosure is connected to a current transformer using a Rogowski coil as the transformation unit 110.

Referring to FIG. 12, when the transformation unit 110 is a current transformer using a Rogowski coil, the first and second nodes 111, 112 of the disconnection detection unit may be connected to both ends of the Rogowski coil, respectively, to configure a circuit of the disconnection detection unit 120 connected through the Rogowski coil.

In the case of a Rogowski coil that does not use an iron core, there is no need to worry about a distortion of an output waveform due to saturation like a general current transformer because air is used as a passage for a magnetic flux. However, there is a problem in that the output voltage waveform contains a lot of interference such as noise, and a phase of the output voltage waveform is delayed by 90 degrees with respect to the input current waveform. In addition, there is a problem in that the output is changed by a position, an angle, and the like of a power cable passing through the Rogowski coil.

Due to such a problem, when the Rogowski coil is employed, an integration circuit or an integration program capable of restoring a waveform delayed by 90 degrees is required. Accordingly, although not shown, when the Rogowski coil is employed, the integration circuit may be further included between the disconnection detection unit 120 and the disconnection determination unit 150. Alternatively, instead of the integration circuit, the disconnection determination unit 150 may further include an integrator (not shown) that performs integration according to a preset integration algorithm to restore the delayed waveform.

In addition, a noise filter circuit or a digital filter for removing noise may be further provided in the disconnection determination unit 150, and the transformation unit 110 and the disconnection detection unit 120 may be designed to have a structure that allows the Rogowski coil and the cable passing through the Rogowski coil to be constantly maintained. In this case, when it is necessary to adjust a magnitude of the detected voltage, the disconnection detection unit 120 may be configured to further include a voltage dividing resistor.

Meanwhile, in the foregoing description, it has been described on the assumption that the disconnection detection unit 120 has a circuit structure constituting a voltage dividing resistor configured with the first resistor (R1) 125, the second resistor (R2) 126, and the third resistor (R3) 127, but any one of the first to third resistors 125, 126, 127 may of course be omitted.

Figure 13:
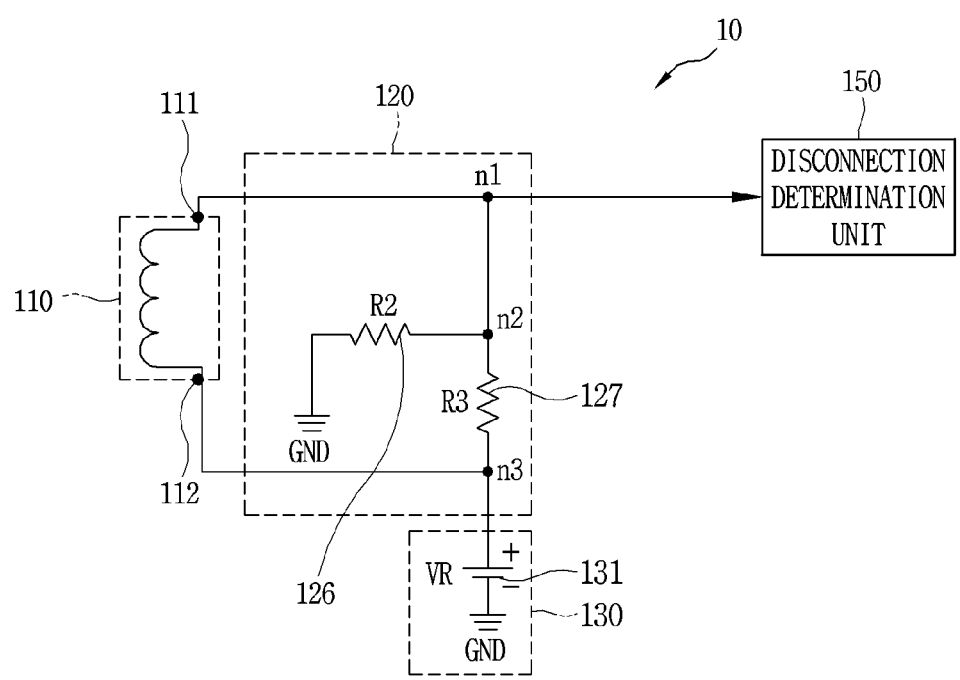
FIGS. 13 to 14 are exemplary diagrams illustrating examples of a disconnection detection unit having a structure in which any one of resistors constituting a voltage dividing resistor is omitted in a protective relay according to an embodiment of the present disclosure.
Figure 14:
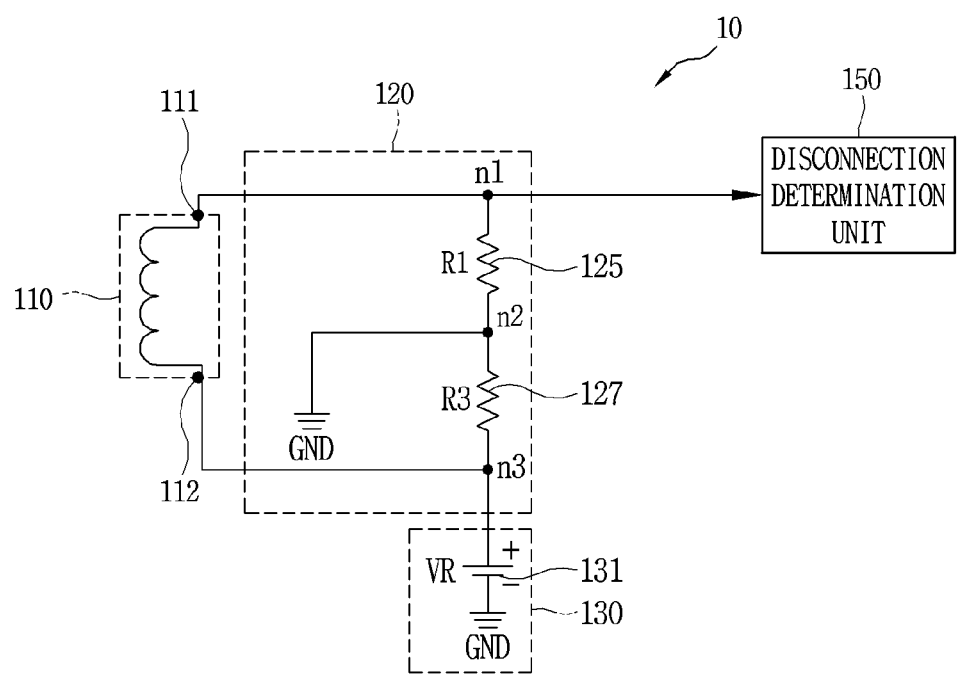

FIGS. 13 to 14 are exemplary diagrams illustrating examples of the disconnection detection unit 120 having a structure in which any one of resistors constituting a voltage dividing resistor is omitted as described above in the protective relay 10 according to an embodiment of the present disclosure.

First, referring to FIG. 13, FIG. 13 shows an example in which the first resistor (R1) 125 is omitted or a resistance value of the first resistor (R1) 125 is 0 ohm.

The first resistor (R1) 125 is provided to prevent a voltage applied to the second contact (n2) 122 from being applied to the first contact (n1) 121, thereby preventing an excessive voltage from being applied to the disconnection determination unit 150, that is, the conversion unit 156, due to being connected to the first contact (n1) 121 when the excessive voltage is applied to the second contact (n2) 121.

Meanwhile, when the circuit is normally connected, a signal of the reference voltage VR may be applied to the first contact (n1) 121. Furthermore, when the circuit is in a disconnected state, a signal less than the reference voltage VR may be applied. Accordingly, when a magnitude of the reference voltage VR is appropriate (when it is not large enough to cause damage to the conversion unit 156), an excessive voltage may not be applied to the conversion unit 156 even when the first resistor (R1) 125 is not provided. Therefore, as shown in FIG. 13, the disconnection detection unit 120 may have a structure in which the first resistor (R1) 125 is omitted.

Meanwhile, referring to FIG. 14, FIG. 14 shows an example in which the second resistor (R2) 126 is omitted or a resistance value of the second resistor (R2) 126 is 0 ohm.

Referring to FIG. 14, since the second resistor (R2) 126 is omitted, when a magnitude of the voltage signal applied to the second contact (n2) 122 is calculated (Equation 2 above) in a case where the circuit is in a disconnected state, the magnitude of the voltage signal applied to the second contact (n2) 122 may be 0 V. Furthermore, when the magnitude of the voltage signal applied to the second contact (n2) 122 is 0 V, the magnitude of the voltage signal applied to the first contact (n1) 121 may also be 0 V when the circuit is in a disconnected state.

On the contrary, when the circuit is normally connected, a magnitude of a voltage signal applied to the first contact (n1) 121 may be the reference voltage VR that is the same as that of a voltage signal applied to the third contact (n3) 123 as described above. Therefore, when the second resistor (R2) 126 is omitted, a difference between the DC offset value in a normal circuit state and the DC offset value in a disconnection state, which are detected through the conversion unit 156, may have a large drop to 0 V from the reference voltage VR.

However, in this case, the conversion unit 156 must be able to receive a voltage signal of 0 V from the reference voltage VR. That is, when an input signal range of the conversion unit 156 includes a range between the reference voltage VR and 0 V, as shown in FIG. 14, the disconnection detection unit 120 may have a structure in which the second resistor (R2) 126 is omitted.

Meanwhile, in the foregoing description, it has been described that the reference voltage generation unit 129 has a ground voltage as an example. However, the reference voltage generation unit 129 may also of course be configured to further include a separate voltage generation unit 1500 to have a higher voltage than the ground.

Figure 15:
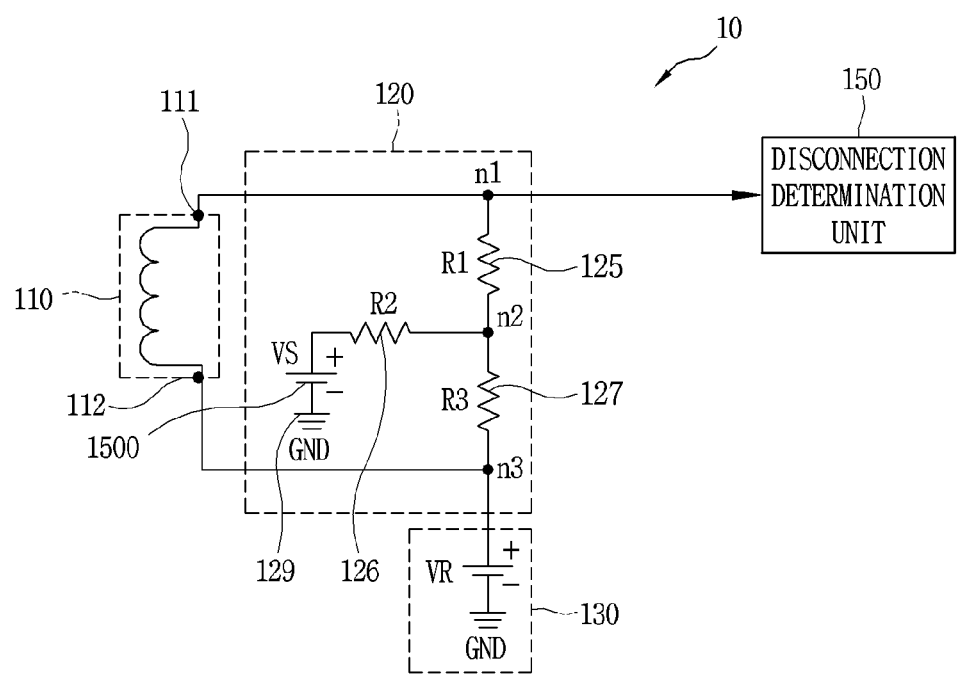
FIG. 15 is a circuit diagram illustrating a structure of a disconnection detection unit having a structure including a voltage generation unit that applies a preset voltage instead of a ground voltage in a protective relay according to an embodiment of the present disclosure.

FIG. 15 is a circuit diagram illustrating an example of the disconnection detection unit 120 having a structure in which the reference voltage generation unit 129 further includes a separate voltage generation unit that applies a preset voltage instead of the ground voltage as described above in the protective relay 10 according to the embodiment of the present disclosure.

As shown in FIG. 15, when the reference voltage generation unit 129 further includes a separate voltage generation unit 1500 to have a higher voltage than the ground, a reference voltage generated by the reference voltage generation unit 129 may be determined according to the separately connected voltage generation unit 1500. Accordingly, in the following description, it is assumed that a voltage of the reference voltage generation unit 129 is a voltage VS of the added voltage generation unit 1500.

Hereinafter, in order to distinguish the voltage VS of the reference voltage generation unit from the voltage VR applied from the sensing voltage generation unit 130, the voltage VR applied from the sensing voltage generation unit 130 will be referred to as a first reference voltage, and the voltage VS of the reference voltage generation unit as a second reference voltage.

Meanwhile, in the case of the disconnection detection unit 120 having the structure shown in FIG. 15, when the connection state of the circuit is normal, the same voltage signal as that applied to the third contact (n3) 123 may be applied to the first contact (n1) 121 connected to the disconnection determination unit 150. Accordingly, a voltage signal having a first reference voltage VR may be applied to the first contact (n1) 121 as shown below in Equation 3.

$$n1(V)=n3(V)=VR \quad \text{[Equation 3]}$$

Here, n1(v) is a magnitude of a voltage signal applied to the first contact 121, n3(v) is a magnitude of a voltage signal applied to the third contact 123, and VR is the first reference voltage.

On the contrary, when the circuit is disconnected due to the transformation unit 110, a voltage signal that is the same as that applied to the second contact (n2) 122 may be applied to the first contact (n1) 121 connected to the disconnection determination unit 150. Accordingly, a voltage signal having a voltage in which a voltage difference between the second reference voltage VS and the first reference voltage VR is divided by the second resistor (R2) 126 and the third resistor (R3) 127 may be applied to the second contact (n2) 122.

In this case, when the second reference voltage VS has a smaller value than the first reference voltage VR, a voltage signal having a voltage in which a voltage difference between the second reference voltage VS and the first reference voltage (VR) is divided by the second resistor (R2) 126 and the third resistor (R3) 127 may be applied to the second contact (n2) 122. Equation 4 below represents a magnitude of a voltage signal applied to the second contact (n2) 122 in this case.

$$n2(V) = (VR - VS) \times \frac{R2}{R2 + R3}, \text{ (if, } VS < VR) \quad \text{[Equation 4]}$$

Here, n2(v) is a magnitude of a voltage signal applied to the second contact 122, VR is a first reference voltage, VS is a second reference voltage, R2 is a resistance value of the second resistor (R2) 126, and R3 is a resistance value of the third resistor (R3) 127.

Accordingly, as shown above in Equation 4, the DC offset value (voltage) detected from a voltage signal detected at the first contact (n1) 121 when the circuit is in a disconnected state may be less than that extracted from the voltage signal VR detected at the first contact (n1) 121 when the circuit is in a normal state.

Meanwhile, when the second reference voltage VS has a value greater than the first reference voltage VR, a voltage signal applied to the second contact (n2) 122 may have a voltage greater than the first reference voltage VR as shown below in Equation 5.

$$n2(V) = VR + (VS - VR) \times \frac{R2}{R2 + R3}, \text{ (if, } VS > VR) \quad \text{[Equation 5]}$$

Here, n2(v) is a magnitude of a voltage signal applied to the second contact 122, VR is a first reference voltage, VS is a second reference voltage, R2 is a resistance value of the second resistor (R2) 126, and R3 is a resistance value of the third resistor (R3) 127.

That is, when a power source having a voltage VS greater than the first reference voltage VR is connected to the reference voltage generation unit 129, a DC offset value detected from a voltage signal detected at the first contact (n1) 121 when the circuit is in a disconnected state may be greater than that extracted from a voltage signal VR detected at the first contact (n1) 121 when the circuit is in a normal state.

Accordingly, the control unit 155 may determine that the circuit is disconnected when the DC offset value extracted from the voltage signal detected by the disconnection detection unit 120 has a value less than the threshold voltage VR, but determine that the circuit is disconnected when the DC offset value has a value greater than the threshold voltage VR.

Figure 16:
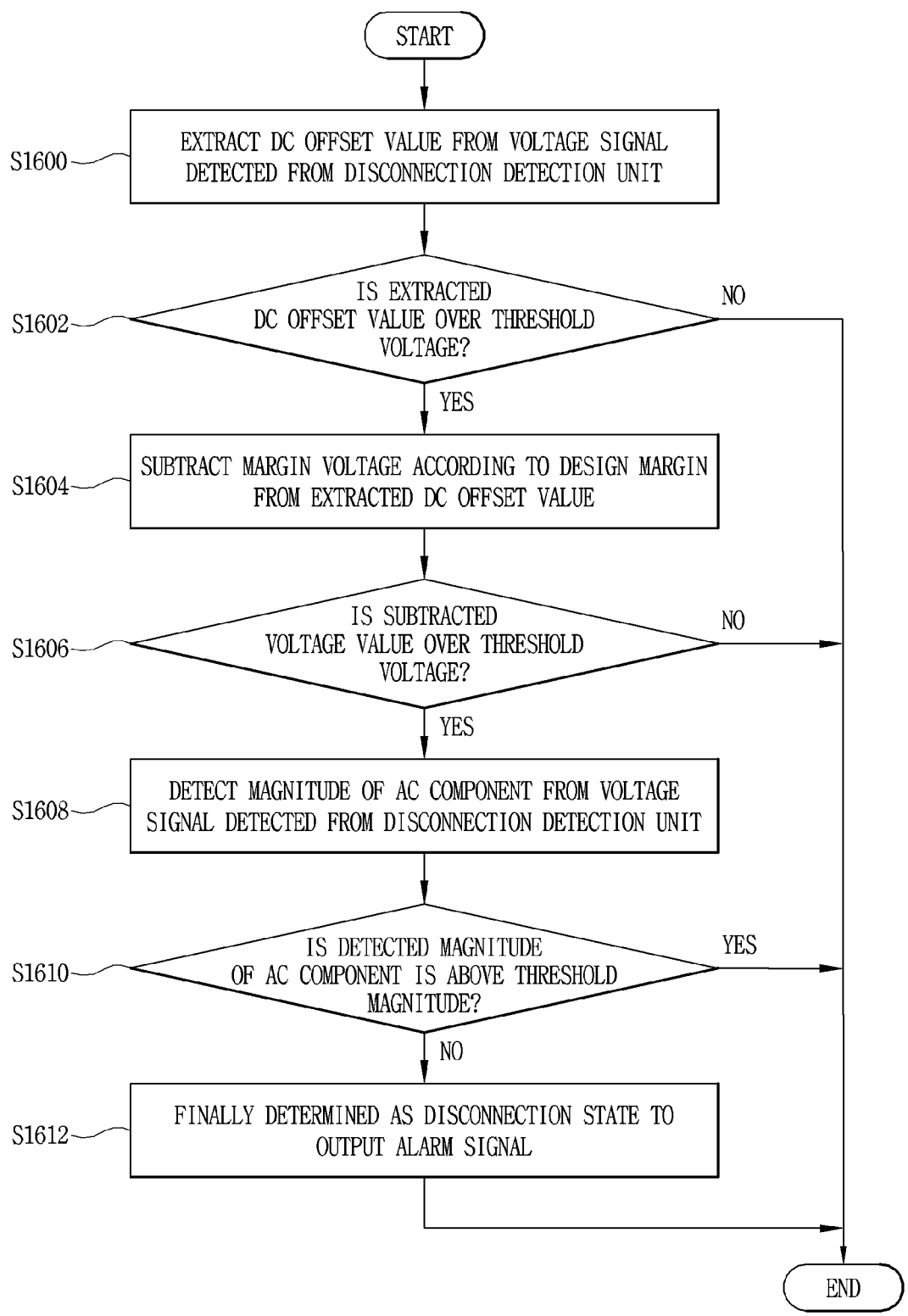
FIG. 16 is a flowchart illustrating an operation process of a disconnection determination unit that determines whether the transformation unit is disconnected according to a voltage signal detected from the disconnection detection unit in the protective relay having the structure illustrated in FIG. 15.

FIG. 16 is a flowchart illustrating an operation process of the disconnection determination unit 150 configured to determine whether the transformation unit 110 is disconnected according to a voltage signal detected from the disconnection detection unit 120 in the protective relay 10 according to an embodiment of the present disclosure, in this case. In the following description, it will be described on the assumption that the second reference voltage VS has a value greater than the first reference voltage VR.

Referring to FIG. 16, in a case where a preset period expires, when a voltage signal from the disconnection detection unit 120, that is, a voltage signal applied to the first contact 121 connected to the disconnection detection unit 120 is detected, the control unit 155 may extract a value of a direct current (DC) component, that is, a DC offset value, from the sampling digital data of one cycle that has been converted through the conversion unit 156 (S1600).

In addition, the control unit 155 may control the first determination unit 151 to compare the extracted DC offset value with a preset threshold voltage to primarily determine whether a circuit is disconnected (S1602).

As described above, a circuit in which the third contact 123 and the first contact 121 are connected through the transformation unit 110 may be configured when the circuit connected to the transformation unit 110 is in a normal state. Therefore, a reference voltage VR of the sensing voltage generation unit 130 connected to the third contact 123 may be applied to the first contact 121 through the transformation unit 110. Therefore, a DC offset value of a voltage signal corresponding to the reference voltage VR may be extracted through the conversion unit 156.

On the contrary, when the circuit is disconnected by the transformation unit 110, the first contact 121 and the third contact 121 may not be connected between each other. Then, the same voltage signal as that of the second contact 122 may be applied to the first contact 121 as shown above in Equation 3.

Meanwhile, a voltage signal having a voltage in which a voltage difference between the second reference voltage VS and the first reference voltage VR is divided by the second resistor (R2) 126 and the third resistor (R3) 127 may be applied to the second contact (n2) 122. In this case, since the second reference voltage VS has a value greater than the first reference voltage VR as described above, as shown above in Equation 5, a magnitude of the voltage signal applied to the second contact (n2) 122 may be calculated according to a voltage difference between the second reference voltage VS and the first reference voltage VR, the second resistor (R2) 126, and the third resistor (R3) 127.

Furthermore, in this case, since the second reference voltage VS has a value greater than the first reference voltage VR, a voltage signal having a voltage greater than the first reference voltage VR may be applied to the second contact (n2) 122. Therefore, a magnitude of the DC offset value extracted when the connection of the circuit is in a disconnected state may have a value greater than that of the DC offset value extracted when the connection of the circuit is in a normal state.

Accordingly, in a case where the threshold voltage is the first reference voltage VR, when the circuit is in a disconnected state in the step S1602, a DC offset value extracted in the step S1600 may have a value greater than the threshold voltage (first reference voltage VR). Therefore, as a result of the determination in step S1602, when a magnitude of the currently extracted DC offset value is greater than the threshold voltage, the control unit 155 may primarily determine that the circuit connected to the current transformation unit 110 is disconnected.

On the contrary, in the step S1602, when the DC offset value extracted in the step S1600 is not greater than the threshold value, the control unit 155 may determine that the circuit is not disconnected. Furthermore, when it is determined that the circuit is not disconnected as a result of the determination in the step S1602, the control unit 155 may end a disconnection determination process in a current period.

Meanwhile, when the circuit connected to the transformation unit 110 is in a disconnected state as a result of the primary disconnection determination in the step S1602, the control unit 155 may subtract a voltage value according to a design margin from the currently extracted DC offset value (S1604). Here, the voltage value according to the design margin may further include a preset error value. Here, the error value may be a measurement error, and may further include an error that may occur in a conversion process of the conversion unit 156.

In the step S1604, when a design margin including the error value is subtracted from the DC offset value, the control unit 155 may control the second determination unit 152 to compare a voltage value from which the design margin is subtracted with the threshold voltage again (S1606).

In addition, as a result of the comparison in step S1606, when the voltage value obtained by subtracting the design margin from the DC offset value is not greater than the threshold voltage, the control unit 155 may determine that the circuit is in a non-disconnected state. Furthermore, when it is determined that the circuit is not disconnected as a result of the determination in the step S1606, the control unit 155 may end a disconnection determination process in a current period.

However, as a result of the comparison in step S1606, even though the design margin is subtracted from the DC offset value, when the subtracted voltage value is greater than the threshold voltage, the control unit 155 may determine again that the circuit currently connected to the transformation unit 110 is disconnected (secondary disconnection determination).

Meanwhile, when it is secondarily determined that the circuit currently connected to transformation unit 110 is disconnected, the control unit 155 may further detect a magnitude of the AC component from the sampling digital data of one cycle converted through the conversion unit 156 (S1608). In addition, the detected magnitude of the AC component may be compared with a preset fault current signal magnitude (S1610).

On the other hand, when the detected magnitude of the fault current signal is above a preset fault current signal magnitude as a result of the comparison in the step S1610, the control unit 155 may determine that a short-circuit current or an in-rush current according to the start-up of the transformation unit 110 has occurred. In addition, it may be determined that the disconnection state of the circuit according to a result of the determination (secondary disconnection determination) in the step S1606 is erroneously determined due to the occurrence of the short-circuit current or the in-rush current.

That is, when it is determined that a short-circuit current or an in-rush current has occurred according to a result of the determination of the step S1610, the control unit 155 may determine that the circuit is normally connected despite the secondary disconnection determination result. Accordingly, the control unit 155 may end a process of determining whether the circuit is disconnected in a current period without outputting an alarm signal or the like.

On the contrary, as a result of the comparison in the step S1610, when the detected magnitude of the AC component is less than a preset fault current signal magnitude, the control unit 155 may determine that a short-circuit current or an in-rush current according to the start-up of the transformation unit 110 has not occurred. Accordingly, the control unit 155 may finally determine that the circuit currently connected to the transformation unit 110 is disconnected, and may output an alarm signal for transferring the disconnection of the circuit to the user (S1612).

Meanwhile, the operation process of FIG. 16 may be repeatedly carried out according to a preset period. Here, the preset period may be a period corresponding to a period of a signal input to the transformation unit 110 from a line, and in this case, an operation process as shown above in FIG. 16 may be performed every time a main operation of the protective relay 10 is carried out. In this case, the main operation of the protective relay 10 may vary depending on a device connected to the protective relay 10. For example, the main operation may be a relay operation when a device connected to the protective relay 10 is a digital relay, and may be a measurement operation when the connected device is a digital measuring instrument. Furthermore, when the connected device is a power conversion device, the main operation may be a power conversion operation.

Figure 17:
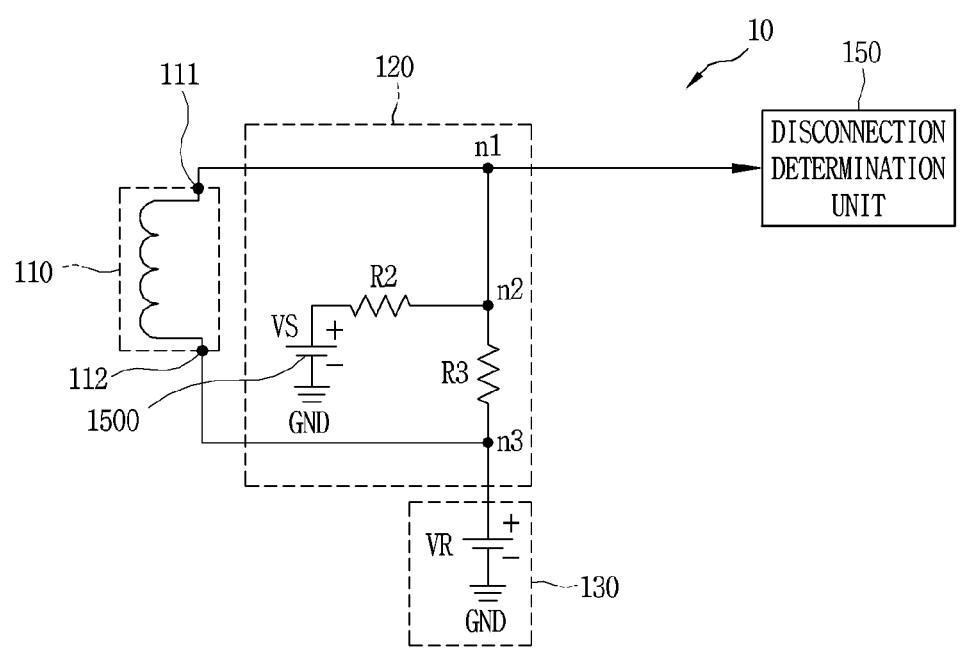
FIGS. 17 to 18 are exemplary diagrams illustrating examples of a disconnection detection unit having a structure in which any one of resistors constituting the voltage dividing resistor is omitted in a protective relay having the structure illustrated in FIG. 15.
Figure 18:
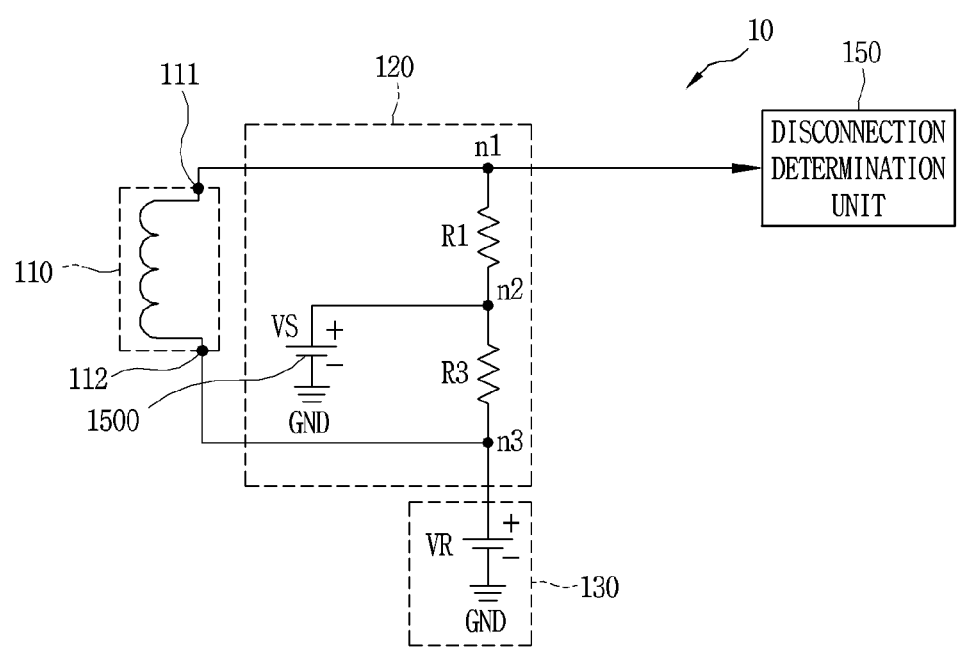

On the other hand, FIGS. 17 and 18 are exemplary diagrams illustrating a circuit structure of the disconnection detection unit 120 when any one of the resistors constituting the voltage dividing resistor is omitted in the protective relay 10 having the structure shown in FIG. 15.

First, referring to FIG. 17, FIG. 17 shows an example in which the first resistor (R1) 125 is omitted or a resistance value of the first resistor (R1) 125 is 0 ohm.

In the case of the first resistor (R1) 125, it is provided to prevent a voltage applied to the second contact (n2) 122 from being applied to the first contact (n1) 121, thereby preventing an excessive voltage from being applied to the disconnection determination unit 150, that is in the case of conversion unit 156, due to being connected to the first contact (n1) 121 when the excessive voltage is applied to the second contact (n2) 121.

Meanwhile, in the case of FIG. 15, a voltage difference between the first reference voltage VS and the second reference voltage VR may divided by the second resistor (R2) 126 and the third resistor (R3) 127 to be applied. In addition, in a case where the first reference voltage VS is less than the second reference voltage VR, since a signal having a voltage less than a voltage of the first reference voltage VR is applied to the first contact (n1) 121 when the circuit is disconnected, a maximum voltage that can be applicable to the first contact (n1) 121 may correspond to the first reference voltage VR. Accordingly, when a magnitude of the first reference voltage VR is appropriate, the disconnection detection unit 120 may have a structure in which the first resistor (R1) 125 is omitted.

On the other hand, when the first reference voltage VS is greater than the second reference voltage VR, a signal having a voltage greater than that of the first reference voltage VR may be applied to the first contact (n1) 121 when the circuit is disconnected. Therefore, as shown in FIG. 17, in order to have a structure in which the first resistor (R1) 125 is omitted, not only the first reference voltage VR but also the second reference voltage VS must have a voltage having an appropriate magnitude, that is, a magnitude that does not damage the conversion unit 156.

Meanwhile, referring to FIG. 18, FIG. 18 shows an example in which the second resistor (R2) 126 is omitted or a resistance value of the second resistor (R2) 126 is 0 ohm in a circuit of the disconnection detection unit 120 illustrated in FIG. 15.

Referring to FIG. 18, since the second resistor (R2) 126 is omitted, in a state where the circuit is in a disconnected state, when a magnitude of a voltage signal applied to the second contact (n2) 122 is calculated according to Equation 4 or 5 above, the magnitude of the voltage signal applied to the second contact (n2) 122 may be 0 V. Furthermore, when the magnitude of the voltage signal applied to the second contact (n2) 122 is 0 V, the magnitude of the voltage signal applied to the first contact (n1) 121 may also be 0 V when the circuit is in a disconnected state.

On the contrary, when the circuit is in a normally connected state, the magnitude of the voltage signal applied to the first contact (n1) 121 may be the first reference voltage VR as described above. Therefore, when the second resistor (R2) 126 is omitted, a difference between the DC offset value in a normal circuit state and the DC offset value in a disconnection state, which are detected through the conversion unit 156, may have a large drop to 0 V from the first reference voltage VR.

However, in this case, the conversion unit 156 must be able to receive a voltage signal of 0 V from the first reference voltage VR. That is, when an input signal range of the conversion unit 156 includes a range between the first reference voltage VR and 0 V, as shown in FIG. 18, the disconnection detection unit 120 further including the second reference voltage VS may have a structure in which the second resistor (R2) 126 is omitted.

Figure 19:
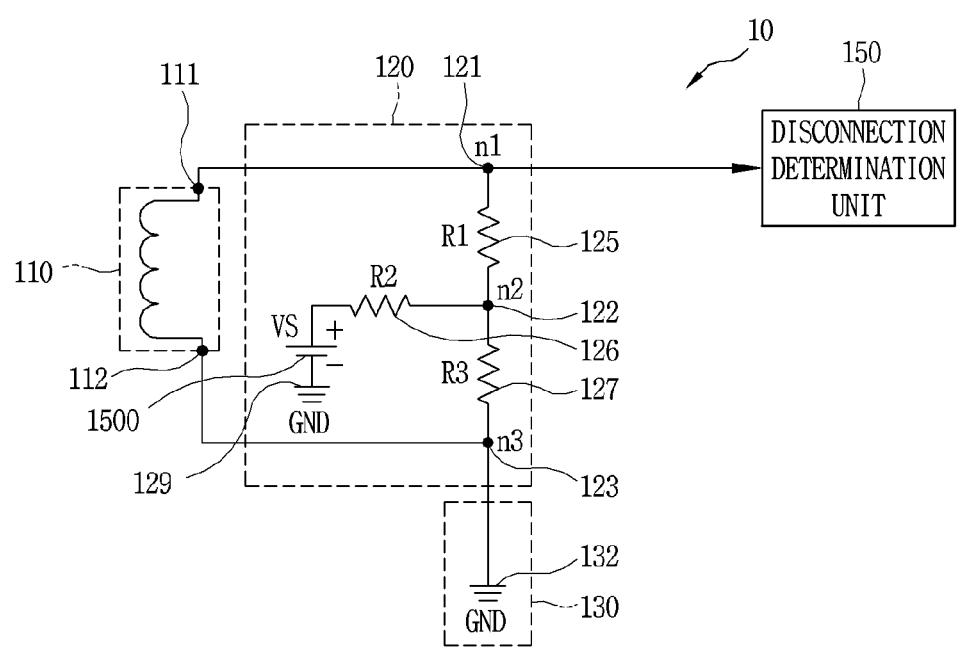
FIG. 19 is a circuit diagram illustrating a structure of a sensing voltage generation unit having a structure that applies a ground voltage instead of a preset voltage in a protective relay according to an embodiment of the present disclosure.

On the other hand, FIG. 19 is a circuit diagram illustrating a structure of the sensing voltage generation unit 130 having a structure that applies a ground voltage as the first reference voltage instead of a preset voltage in the protective relay 10 according to an embodiment of the present disclosure.

As shown above in FIG. 19, when the sensing voltage generation unit 130 applies a ground voltage as the first reference voltage, the reference voltage generation unit 129 must further include a separate voltage generation unit 1500 to provide a second reference voltage different from the ground voltage. In this case, the first reference voltage VR applied from the sensing voltage generation unit 130 may be a ground voltage (0 V), and the voltage VS applied from the voltage generation unit 1500 may be a second reference voltage.

In this case, when the circuit is in a normally-connected state, a voltage signal that is the same voltage signal as a magnitude of a voltage signal applied to the third contact (n3) 123 may be applied to the first contact (n1) 121. In this case, since a signal of the first reference voltage, that is, a ground voltage, is applied to the third contact (n3) 123, a ground voltage, that is, a voltage signal of 0 V, may also be applied to the first contact (n1) 121.

On the contrary, since the second reference voltage VS has a value greater than the first reference voltage VR, when the circuit is disconnected by the transformation unit 110, a magnitude of a voltage signal applied to the first contact (n1) 121 may be determined according to a magnitude of a voltage signal applied to the second contact (n2) 122, as shown above in Equations 4 and 5. Accordingly, when the circuit is disconnected, a voltage signal having a voltage greater than a first reference voltage, that is, a ground voltage, may be applied to the first contact (n1) 121.

Therefore, the control unit 155 of the disconnection determination unit 150 may primarily determine whether the circuit is disconnected according to whether a DC offset value acquired through the conversion unit 156 from a voltage signal of the first contact (n1) 121 detected by the disconnection detection unit 120 is greater than the ground voltage. Furthermore, a secondary disconnection determination may be made by reflecting a design margin according to the primary disconnection determination result, and whether the circuit is disconnected may be finally determined based on a magnitude of an AC component acquired through the conversion unit 156 from a voltage signal of the first contact (n1) 121 according to the secondary disconnection determination result.

Meanwhile, in the foregoing description of the present disclosure, specific embodiments have been described, but various modifications may be made without departing from the scope of the present disclosure. In particular, in the foregoing description, various embodiments in which either one of the second resistor (R2) 126 and the third resistor (R3) 127 is absent or a separate reference voltage is applied have been mentioned, but the present disclosure may not of course be limited to the embodiments, and various modifications and applications not mentioned in the above description may be made by those skilled in the art to which the present disclosure pertains without departing from the essential characteristics of the present disclosure.

For example, the first determination unit 151 and the second determination unit 152 may be determination units that compare a DC offset value acquired through the conversion unit 156 and a value obtained by reflecting a design margin to the DC offset value, respectively, with a preset threshold. However, in this case, the control unit 150 instead of the second determination unit 152 may of course calculate a value obtained by reflecting the design margin to a preset threshold voltage.

Accordingly, the first determination unit 151 and the second determination unit 152 may of course be integrated into one determination unit that compare a value specified by the control unit 155 (a DC offset value acquired through the conversion unit 156 or a value obtained by reflecting a design margin to the acquired DC offset value) with a preset threshold voltage. In this case, the integrated one determination unit may sequentially compare a DC offset value obtained through the conversion unit 156 and a value obtained by reflecting a design margin to the DC offset value with a preset threshold voltage under the control of the control unit 155 to perform the first disconnection determination and the second disconnection determination.

The present disclosure described above may be implemented as computer-readable codes on a program-recorded medium. The computer-readable medium includes all kinds of recording devices in which data readable by a computer system is stored. Examples of the computer-readable medium include a hard disk drive (HDD), a solid state disk (SSD), a silicon disk drive (SDD), a ROM, a RAM, a CD-ROM, a magnetic tape, a floppy disk, an optical data storage device and the like, and also include a device implemented in the form of a carrier wave (for example, transmission via the Internet). In addition, the computer may include the control unit 155 of the disconnection determination unit 150.

The above detailed description is therefore to be construed in all aspects as illustrative and not restrictive. The scope of the invention should be determined by reasonable interpretation of the appended claims and all changes that come within the equivalent scope of the invention are included in the scope of the invention.

The invention claimed is:

1. A protective relay that detects whether a transformation unit and a circuit connected to the transformation unit are disconnected, the protective relay comprising:
a disconnection detection unit comprising a plurality of nodes connected to both output ends of the transformation unit, a reference voltage generation unit that defines a reference voltage, and a plurality of resistors constituting a voltage dividing resistor and connecting between the plurality of nodes and the reference voltage generation unit;
a sensing voltage generation unit that applies a voltage for defining a predetermined voltage difference with respect to the reference voltage to the disconnection detection unit; and
a disconnection determination unit connected to a first node at which a magnitude of a voltage signal applied by the voltage dividing resistor varies according to whether at least one of the transformation unit and a circuit connected to the transformation unit is disconnected, among the plurality of nodes, and configured to detect whether at least one of the transformation unit and a circuit connected to the transformation unit is disconnected from a voltage signal detected from the first node.

2. The protective relay of claim 1, wherein the disconnection determination unit extracts a DC offset value from a voltage signal detected from the first node and compares the extracted DC offset value with a preset threshold voltage to detect a magnitude of an AC component from the voltage signal detected from the first node when the DC offset value is less than the threshold voltage as a result of the comparison, and to determine whether at least one of the transformation unit and a circuit connected to the transformation unit is disconnected based on the detected magnitude of the AC component.

3. The protective relay of claim 2, wherein the disconnection determination unit determines whether at least one of the transformation unit and a circuit connected to the transformation unit is disconnected according to whether the detected magnitude of the AC component is greater than a preset magnitude, and
wherein the preset magnitude is determined according to the magnitude of the AC component included in the voltage signal detected from the first node when a short-circuit current or an in-rush current generated during the start-up of the transformation unit.

4. The protective relay of claim 2, wherein when it is primarily determined that at least one of the transformation unit and a circuit connected to the transformation unit is disconnected according to a result of comparing the extracted DC offset value with a preset threshold voltage, the disconnection determination unit further reflects a preset design margin value to the extracted DC offset value, secondarily determines that at least one of the transformation unit and a circuit connected to the transformation unit is disconnected based on a result of comparing the threshold voltage with the DC offset value to which the design margin value is further reflected, and detects the disconnection of at least one of the transformation unit and the circuit connected to the transformation unit.

5. The protective relay of claim 4, wherein the design margin comprises a preset error value, and wherein the preset error value comprises at least one of a measurement error generated in a process of extracting a DC offset value from a voltage signal detected from the first node and a design error according to a circuit configuration of the disconnection detection unit.

6. The protective relay of claim 2, wherein the threshold voltage is the same voltage as that applied from the sensing voltage generation unit when the reference voltage is a ground voltage.

7. The protective relay of claim 2, wherein when the transformation unit is a transformation unit using a Rogowski coil, an integration circuit for restoring a delay waveform according to the characteristics of the Rogowski coil is included between the disconnection detection unit and the disconnection determination unit, and wherein the disconnection determination unit integrates the DC offset value and detects the disconnection of at least one of the transformation unit and a circuit connected to the transformation unit based on a result of comparing the integrated DC offset value with the threshold voltage.

8. The protective relay of claim 1, wherein the disconnection determination unit further comprises an output unit configured to output an alarm signal indicating a disconnection state of at least one of the transformation unit and a circuit connected to the transformation unit, and wherein the output unit comprises a communication function for transmitting the alarm signal to another preset device.

9. The protective relay of claim 1, wherein the disconnection detection unit comprises:

a first contact disposed between the first node and the disconnection determination unit;

a second node connected to an end that is different either one end to which the first node is connected between both output ends of the transformation unit;

a third contact disposed between the second node and the sensing voltage generation unit;

a second contact disposed in an electric circuit connecting between the first contact and the third contact;

a first resistor disposed between the first contact and the second contact;

a second resistor connected between the second contact and the reference voltage generation unit and disposed between the reference voltage generation unit and the second contact; and a third resistor disposed between the second contact and the third contact.

10. The protective relay of claim 9, wherein when the transformation unit and a circuit connected to the transformation unit are in a normally-connected state, a voltage signal having the same magnitude as a voltage applied from the sensing voltage generation unit is applied to the first node, and wherein a DC offset value detected from a voltage signal applied to the first node when at least one of the transformation unit and a circuit connected to the transformation unit is in a disconnected state is less than a DC offset value detected from a voltage signal applied to the first node when the transformation unit and a circuit connected to the transformation unit are in a normally-connected state.

11. The protective relay of claim 10, wherein in a case where a voltage applied by the sensing voltage generation unit is greater than the reference voltage, when at least one of the transformation unit and a circuit connected to the transformation unit is in a disconnected state, a voltage signal according to a difference between the reference voltage and a voltage applied from the sensing voltage generation unit and a magnitude of a resistance constituting the voltage dividing resistor is applied as shown in Equation below:

$$n1(V) = n2(V), \quad \text{[Equation]}$$
$$n2(V) = (VR - VS) \times \frac{R2}{R2 + R3}, \text{ (if, } VS < VR\text{)}$$

where n1(v) is a magnitude of a voltage signal applied to a first contact, n2(v) is a magnitude of a voltage signal applied to a second contact, VS is a reference voltage, VR is a voltage applied from a sensing voltage generation unit, R2 is a resistance value of a second resistor, and R3 is a resistance value of a third resistor.

12. The protective relay of claim 11, wherein the disconnection determination unit extracts a DC offset value from a voltage signal detected from the first node and when the extracted DC offset value is less than a preset threshold voltage, the disconnection determination unit further adds a preset design margin value to the extracted DC offset value, and compares the DC offset value to which the design margin value is added with the threshold voltage to detect the disconnection of at least one of the transformation unit and a circuit connected to the transformation unit.

13. The protective relay of claim 10, wherein the reference voltage is a ground voltage.

14. The protective relay of claim 9, wherein when the transformation unit and a circuit connected to the transformation unit are in a normally-connected state, a voltage signal having the same magnitude as a voltage applied from the sensing voltage generation unit is applied to the first node, and wherein a DC offset value detected from a voltage signal applied to the first node when at least one of the transformation unit and a circuit connected to the transformation unit is in a disconnected state is greater than a DC offset value detected from a voltage signal applied to the first node when the transformation unit and a circuit connected to the transformation unit are in a normally-connected state.

15. The protective relay of claim 14, wherein in a case where a voltage applied by the sensing voltage generation unit is greater than the reference voltage, when at least one of the transformation unit and a circuit connected to the transformation unit is in a disconnected state, a voltage signal according to a voltage applied from the sensing voltage generation unit, a difference between the voltage applied from the sensing voltage generation unit and the reference voltage, and a magnitude of a resistance constituting the voltage dividing resistor is applied as shown in Equation below:

$$n1(V) = n2(V),$$
$$n2(V) = VR + (VS - VR) \times \frac{R2}{R2 + R3}, \text{ (if, } VS > VR\text{)}$$
[Equation]

where n1 (v) is a magnitude of a voltage signal applied to a first contact, n2(v) is a magnitude of a voltage signal applied to a second contact, VS is a reference voltage, VR is a voltage applied from a sensing voltage generation unit, R2 is a resistance value of a second resistor, and R3 is a resistance value of a third resistor.

16. The protective relay of claim 15, wherein the disconnection determination unit extracts a DC offset value from a voltage signal detected from the first node and when the extracted DC offset value is greater than a preset threshold voltage, the disconnection determination unit subtracts a preset design margin value from the extracted DC offset value, and compares the DC offset value from which the design margin value is subtracted with the threshold voltage to detect the disconnection of at least one of the transformation unit and a circuit connected to the transformation unit.

17. The protective relay of claim 14, wherein a voltage of the sensing voltage generation unit is a ground voltage.

18. The protective relay of claim 1, wherein the disconnection detection unit comprises:
a first contact disposed between the first node and the disconnection determination unit;
a second node connected to an end that is different either one end to which the first node is connected between both output ends of the transformation unit;
a third contact disposed between the second node and the sensing voltage generation unit;
a second contact disposed in an electric circuit connecting between the first contact and the third contact;
a second resistor connected between the second contact and the reference voltage generation unit and disposed between the reference voltage generation unit and the second contact; and
a third resistor disposed between the second contact and the third contact.

19. The protective relay of claim 1, wherein the disconnection detection unit comprises:
a first contact disposed between the first node and the disconnection determination unit;
a second node connected to an end that is different either one end to which the first node is connected between both output ends of the transformation unit;
a third contact disposed between the second node and the sensing voltage generation unit;
a second contact disposed in a circuit connecting between the first contact and the third contact and connected to the reference voltage generation unit; and
a first resistor disposed between the first contact and the second contact; and a third resistor disposed between the second contact and the third contact.

20. A method of detecting a disconnection for a protective relay that detects whether a transformation unit and a circuit connected to the transformation unit are disconnected, the method comprising:
providing a plurality of nodes connected to both output ends of the transformation unit, and providing a plurality of resistors constituting a voltage dividing resistor to detect a voltage signal from a disconnection detection unit in which voltage signals applied to the plurality of nodes vary according to whether at least one of the transformation unit and a circuit connected to the transformation unit is disconnected, and acquire a DC offset value from the detected voltage signal;
comparing the acquired DC offset value with a preset threshold voltage to primarily determine whether at least one of the transformation unit and a circuit connected to the transformation unit is disconnected;
calculating a magnitude of an AC component from the detected voltage signal according to the primary determination result;
comparing the calculated magnitude of the AC component with a preset AC current signal magnitude to determine whether a short-circuit current or an in-rush current of the transformation unit is generated; and
secondarily determining whether at least one of the transformation unit and a circuit connected to the transformation unit is disconnected according to a result of determining whether the short-circuit current or the in-rush current is generated.

21. The method of claim 20, wherein the primarily determining of whether there is a disconnection comprises:
comparing the acquired DC offset value with a preset threshold voltage;
reflecting a preset design margin value to the DC offset value according to a comparison result between the DC offset value and a preset threshold voltage; and
comparing the DC offset value to which the design margin value is reflected with the threshold voltage to determine whether at least one of the transformation unit and a circuit connected to the transformation unit is disconnected.

22. The method of claim 20, wherein the secondarily determining of whether there is a disconnection further comprises outputting alarm information indicating a disconnection state when it is determined that at least one of the transformation unit and a circuit connected to the transformation unit is disconnected as a result of the secondary determination, and
wherein when it is determined that the transformation unit and a circuit connected to the transformation unit are normally connected, the method further comprises acquiring the DC offset value or performing the secondarily determining whether there is a disconnection according to whether a preset period has expired.

23. The method of claim 22, wherein the preset period is determined based on a time period during which a main operation of a device connected to the protective relay is performed.

* * * * *